(12) United States Patent
Gunji

(10) Patent No.: US 10,304,914 B2
(45) Date of Patent: May 28, 2019

(54) DISPLAY DEVICE WITH TRENCH PASSING THROUGH PARTITION WALL

(71) Applicant: Japan Display Inc., Tokyo (JP)

(72) Inventor: Masakazu Gunji, Tokyo (JP)

(73) Assignee: Japan Display Inc., Tokyo (JP)

( * ) Notice: Subject to any disclaimer, the term of this patent is extended or adjusted under 35 U.S.C. 154(b) by 66 days.

(21) Appl. No.: 15/494,590

(22) Filed: Apr. 24, 2017

(65) Prior Publication Data

US 2018/0012944 A1 Jan. 11, 2018

(30) Foreign Application Priority Data

Jul. 8, 2016 (JP) .................................. 2016-135669

(51) Int. Cl.
| | |
|---|---|
| *H01L 33/00* | (2010.01) |
| *H01L 27/32* | (2006.01) |
| *H01L 51/52* | (2006.01) |
| *H01L 27/146* | (2006.01) |
| *H01L 27/12* | (2006.01) |
| *H01L 51/00* | (2006.01) |

(52) U.S. Cl.
CPC ........ *H01L 27/3246* (2013.01); *H01L 27/124* (2013.01); *H01L 27/1463* (2013.01); *H01L 27/322* (2013.01); *H01L 27/3211* (2013.01); *H01L 27/3244* (2013.01); *H01L 27/3258* (2013.01); *H01L 27/3262* (2013.01); *H01L 51/0097* (2013.01); *H01L 51/5278* (2013.01); *H01L 27/326* (2013.01); *H01L 2227/323* (2013.01); *H01L 2251/5338* (2013.01); *Y02E 10/549* (2013.01)

(58) Field of Classification Search
CPC ............. H01L 27/3246; H01L 27/3258; H01L 51/0097; H01L 27/3211; H01L 27/322; H01L 27/3262; H01L 27/124; H01L 2227/323; H01L 27/326; H01L 2251/5338; H01L 27/3244; H01L 27/1463; H01L 51/5278
See application file for complete search history.

(56) References Cited

U.S. PATENT DOCUMENTS

| | | | | |
|---|---|---|---|---|
| 7,619,258 | B2* | 11/2009 | Tsuchiya | H01L 27/3246 257/83 |
| 8,618,568 | B2* | 12/2013 | Aoyama | H01L 51/0013 257/40 |
| 8,981,352 | B2 | 3/2015 | Yamada et al. | |
| 2007/0132374 | A1* | 6/2007 | Park | H01L 27/3253 313/504 |

(Continued)

FOREIGN PATENT DOCUMENTS

| | | |
|---|---|---|
| JP | 2011-044271 A | 3/2011 |
| JP | 2012-216338 A | 11/2012 |

*Primary Examiner* — Shouxiang Hu
(74) *Attorney, Agent, or Firm* — Typha IP LLC

(57) ABSTRACT

Provided is a display device including a first sub-pixel, a second sub-pixel adjacent to the first sub-pixel. The first sub-pixel and the second sub-pixel each include a semiconductor film, a gate electrode, a gate insulating film, an interlayer insulating film, and a leveling film and further possesses a light-emitting element located over the leveling film. The display device has a partition wall located between the first sub-pixel and the second sub-pixel and a trench passing through the leveling film.

17 Claims, 25 Drawing Sheets

(56) References Cited

U.S. PATENT DOCUMENTS

2010/0007272 A1* 1/2010 Toyoda ............... H01L 51/5203
                                                    313/504
2010/0051993 A1* 3/2010 Shimoda ............. H01L 27/3246
                                                    257/98

* cited by examiner

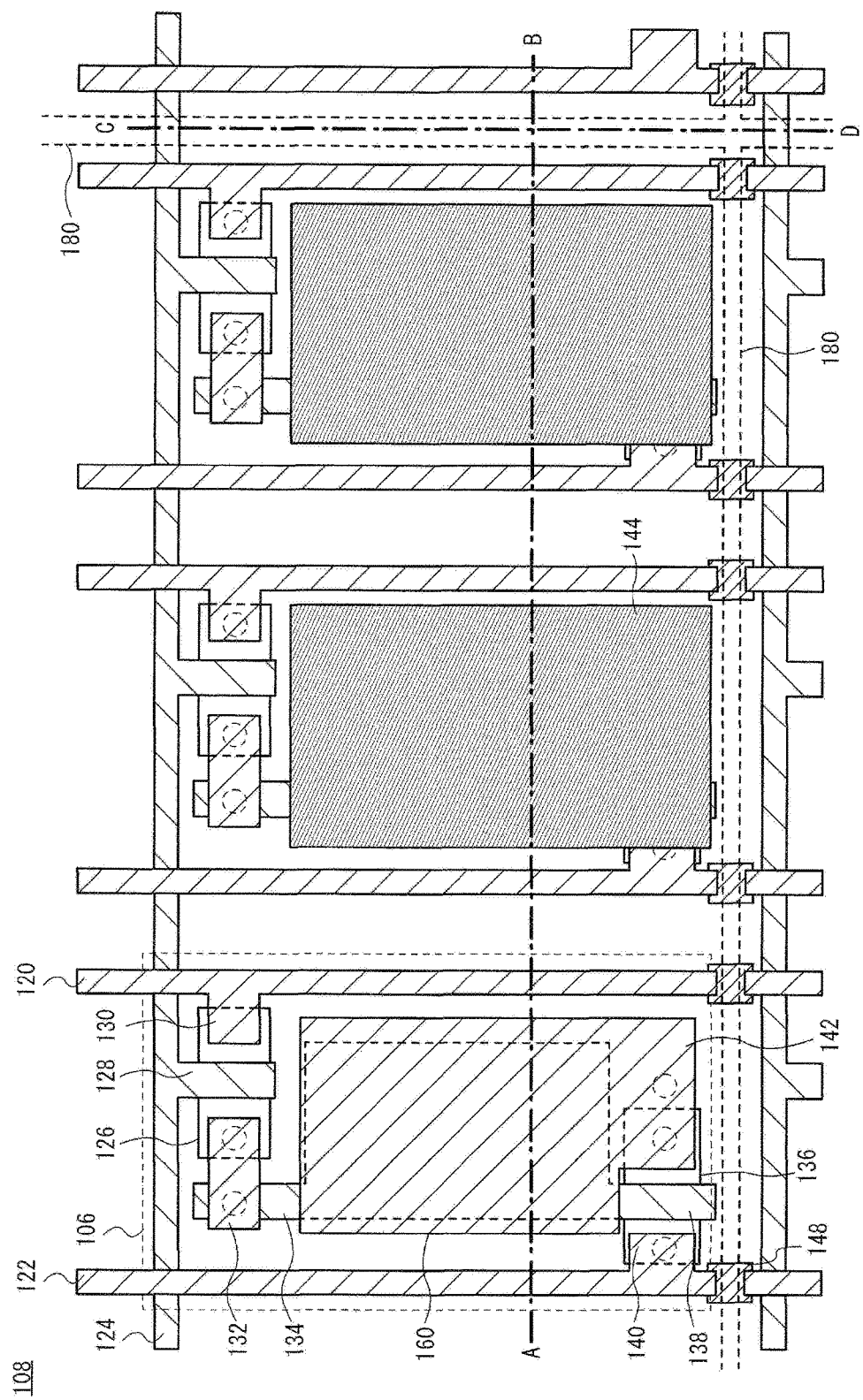

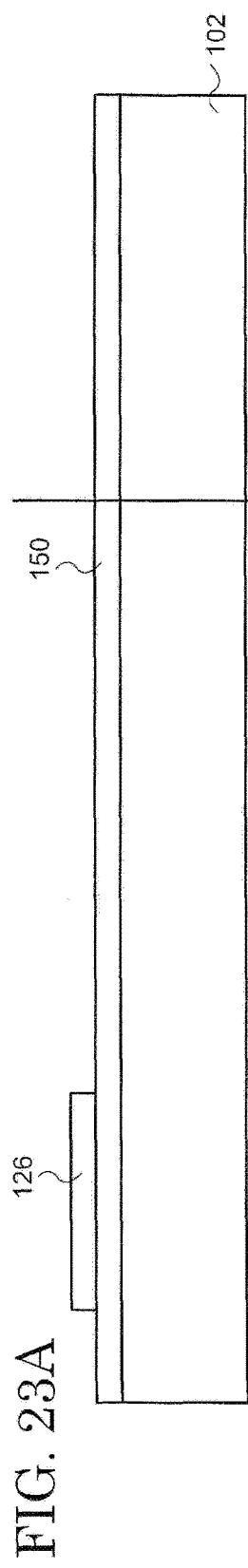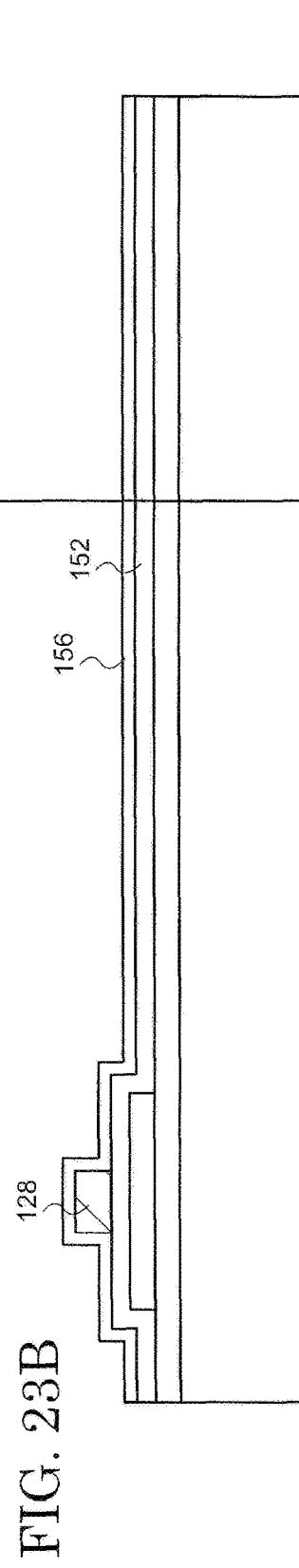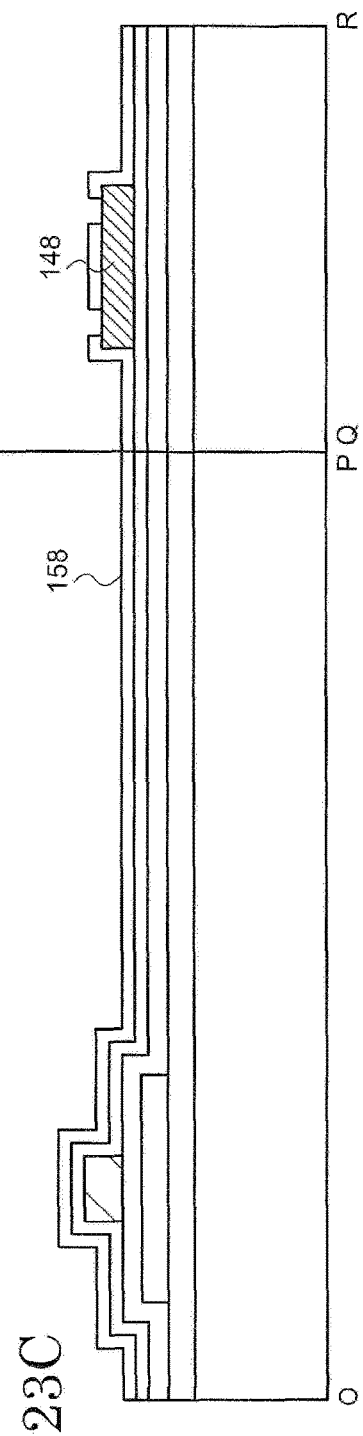
FIG. 23A
FIG. 23B
FIG. 23C

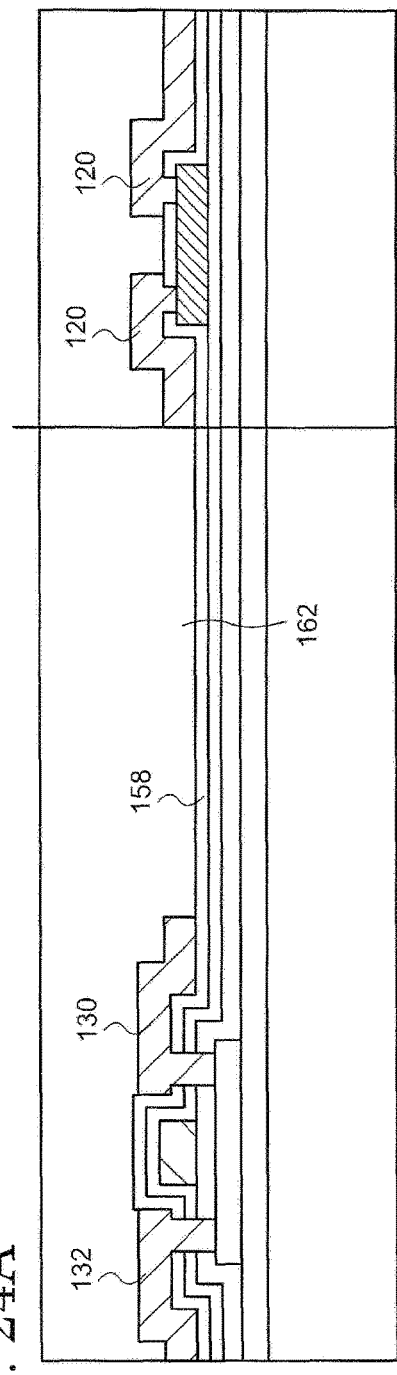
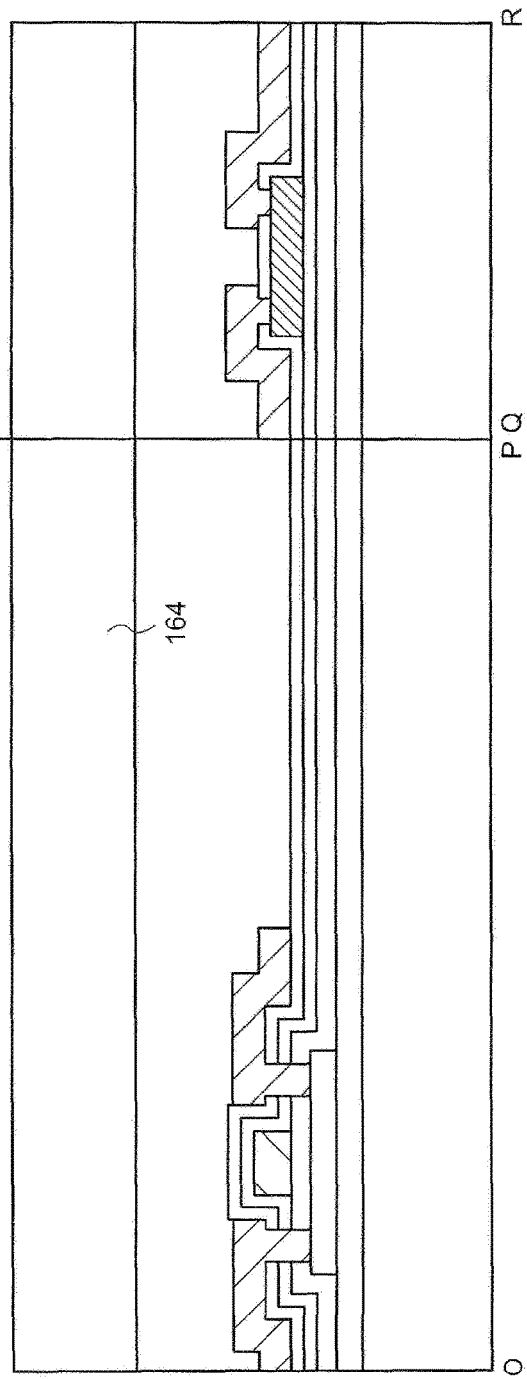

DISPLAY DEVICE WITH TRENCH PASSING THROUGH PARTITION WALL

CROSS REFERENCE TO RELATED APPLICATIONS

This application is based on and claims the benefit of priority from the prior Japanese Patent Application No. 2016-135669, filed on Jul. 8, 2016, the entire contents of which are incorporated herein by reference.

FIELD

The present invention relates to a display device exemplified by a flexible EL display device.

BACKGROUND

As a typical example of a display device, a liquid crystal display device, an organic EL (Electroluminescence) device, and the like having a liquid crystal element or a light-emitting element in each pixel are represented. These display devices have a display element such as a liquid crystal element or an organic light-emitting element (hereinafter, referred to as a light-emitting element) in each of a plurality of pixels formed over a substrate. A liquid crystal element and a light-emitting element have a layer including a liquid crystal and an organic compound, respectively, between a pair of electrodes and are operated by applying a voltage or supplying a current between the pair of electrodes.

Each pixel of a display device is provided with a semiconductor element such as a transistor by which operation of a liquid crystal element and a light-emitting element is controlled. Use of such a so-called active-matrix type display device enables high-resolution display. For example, an active-matrix type organic EL display device provided with a plurality of pixels having light-emitting elements showing different colors and transistors is disclosed in Japanese patent application publication 2012-216338.

SUMMARY

A display device according to an embodiment of the present invention includes a first sub-pixel, a second sub-pixel adjacent to the first sub-pixel, and a partition wall located at a boundary between the first sub-pixel and the second sub-pixel. The first sub-pixel and the second sub-pixel each include: a thin-film transistor having a semiconductor film, a gate electrode, a source electrode, and a drain electrode, the source electrode and the drain electrode being electrically connected to the semiconductor film; a gate insulating film between the semiconductor film and the gate electrode; an interlayer insulating film over the semiconductor film, the gate electrode, and the gate insulating film and under the source electrode and the drain electrode; a leveling film over the source electrode and the drain electrode; and a light-emitting element located over the leveling film and having an EL layer between a first electrode and a second electrode. An edge portion of the first electrode is covered by the partition wall, and a part of the second electrode is located over the partition wall. An overlapping region where the leveling film overlaps with the partition wall in a plane view is located between the first sub-pixel and the second sub-pixel. A trench passing through the leveling film and the partition wall is located in the overlapping region, and the EL layer is in contact with the interlayer insulating film via the trench.

A display device according to an embodiment of the present invention includes a first pixel, a second pixel adjacent to the first pixel, and a partition wall located at a boundary between the first pixel and the second pixel. The first pixel and the second pixel each have a first sub-pixel including: a thin-film transistor having a semiconductor film, a gate electrode, a source electrode, and a drain electrode, the source electrode and the drain electrode being electrically connected to the semiconductor film; a gate insulating film between the semiconductor film and the gate electrode; an interlayer insulating film over the semiconductor film, the gate electrode, and the gate insulating film and under the source electrode and the drain electrode; a leveling film over the source electrode and the drain electrode; and a light-emitting element located over the leveling film and having an EL layer between a first electrode and a second electrode. An edge portion of the first electrode is covered by the partition wall, and a part of the second electrode is located over the partition wall. An overlapping region where the leveling film overlaps with the partition wall in a plane view is located between the first pixel and the second pixel. A trench passing through the partition wall and reaching at least a part of the leveling film is located in the overlapping region, and the EL layer is in contact with a bottom surface of the trench.

BRIEF DESCRIPTION OF DRAWINGS

FIG. 3 is a schematic top view of a display device according to an embodiment;

FIG. 23A to FIG. 23C are schematic views showing a manufacturing method of a display device according to an embodiment;

FIG. 24A and FIG. 24B are schematic views showing a manufacturing method of a display device according to an embodiment.

DESCRIPTION OF EMBODIMENTS

Figure 1:
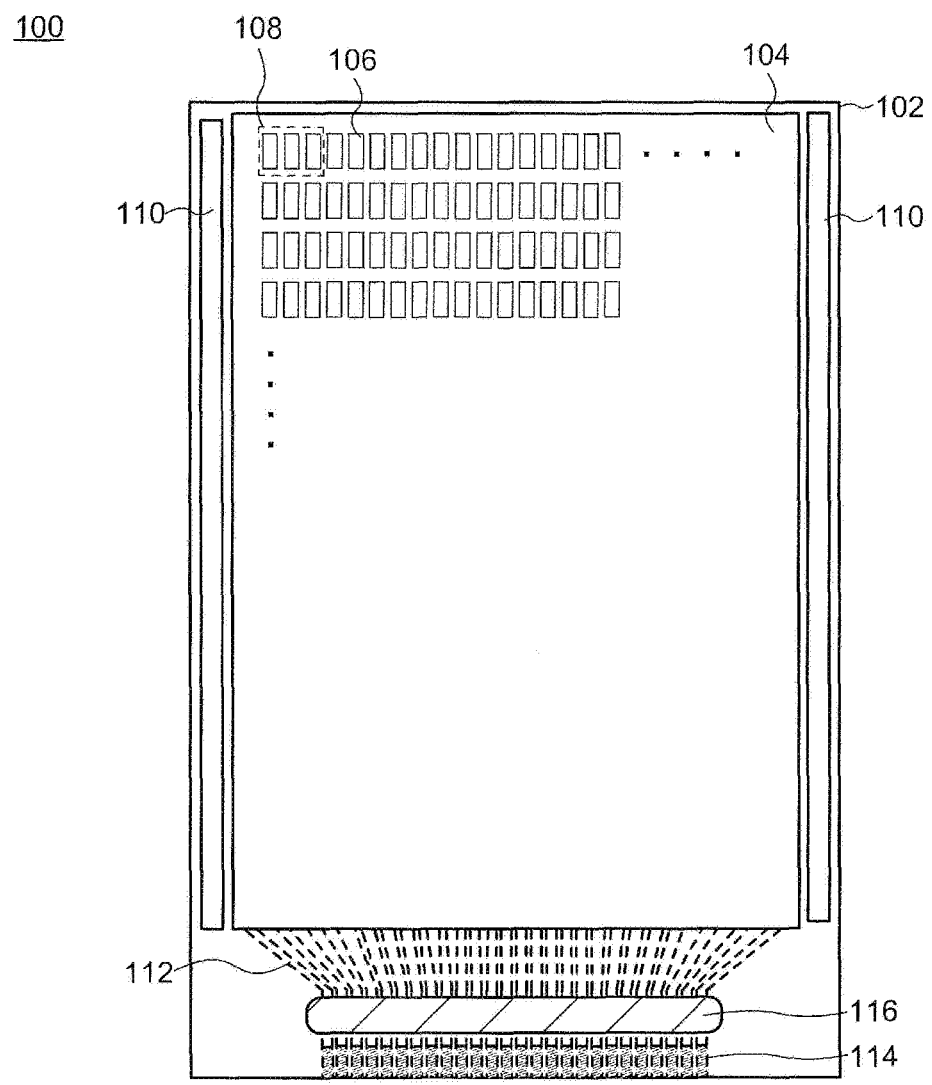
FIG. 1 is a schematic top view of a display device according to an embodiment.

Hereinafter, each embodiment of the present invention is explained with reference to the drawings. The invention can be implemented in a variety of modes within the scope of the concept and should not be interpreted as being limited to the disclosure of the following embodiments.

In the drawings, the width, thickness, shape, and the like of each component may be schematically illustrated and different from those of an actual mode in order to provide a clearer explanation. However, the drawings simply give an example and do not limit the interpretation of the present invention. In the specification and each of the drawings, the same reference number is provided to an element which is the same as that appearing in preceding drawings, and a detailed explanation may be omitted as appropriate.

In the present invention, when a plurality of films is formed by processing one film, the plurality of films may have functions or roles different from each other. However, the plurality of films originates from a film which is formed as the same layer in the same process. Therefore, the plurality of films is defined as films existing in the same layer.

<First Embodiment>

In the present embodiment, a display device according to an embodiment of the present invention is explained by using FIG. 1 to FIG. 10B.

A top view of a display device 100 according to an embodiment is shown in FIG. 1. The display device 100 has a display region 104 including a plurality of pixels 108 and gate-side driver circuits (hereinafter, referred to as driver circuits) 110 over one surface (top surface) of a base material 102. In a plurality of sub-pixels 106 included in one pixel 108, light-emitting elements different in emission color from one another can be provided, by which full-color display can be accomplished. For example, red-emissive, green-emissive, and blue-emissive light-emitting elements may be arranged in the corresponding three sub-pixels 106. Alternatively, a white-emissive light-emitting element is used in all of the sub-pixels 106, and full-color display may be performed by extracting red, green, and blue colors from the corresponding sub-pixels 106 by using a color filter. The colors eventually extracted are not limited to a combination of red, green, and blue colors. For instance, four kinds of colors of red, green, blue, and white can be extracted from four sub-pixels 106 by constructing one pixel 108 so as to have four sub-pixels 106. An arrangement of the sub-pixels 106 is also not limited, and a stripe arrangement, a delta arrangement, a mosaic arrangement, and the like may be employed.

Wirings 112 extend to a side surface (a short side of the display device 100 in FIG. 1) of the base material 102 from the display region 104 and are exposed at an edge portion of the base substrate 102. The exposed portions form terminals 114. The terminals 114 are connected to a connector (not shown) such as a flexible printed circuit (FPC). The display region 104 is also electrically connected to an IC chip 116 through the wirings 112, by which image signals supplied from an external circuit (not shown) are provided to the sub-pixels 106 through the driver circuits 110 and the IC chip 116, enabling light-emission of the sub-pixels 106 to be controlled and an image to be reproduced on the display region 104. Although not shown, the display device 100 may possess a source-side driver circuit at a periphery of the display region 104 instead of the IC chip 116. In the present embodiment, two driver circuits 110 are disposed so as to sandwich the display region 104. However, a single driver circuit 110 may be used. Furthermore, the driver circuits 110 may not be formed over the base substrate 102, and a driver circuit provided over a different substrate may be mounted over the connector.

The base material 102 has a function to support the display region 104, the driver circuits 110, and the like formed thereover. The use of a flexible base material 102 provides flexibility to the whole of the display device 100, allowing the display device 100 to be deformed by folding or bending. In this case, the base material 102 is also called a base film. The base material 102 may include a polymer material such as a polyimide, a polyester, a polyamide, and an acrylic resin. It is preferred to use a polymer material such as a polyimide and a polyamide having chemical durability and physical strength to the process for fabricating layers (described below) formed over the base material 102.

Figure 2A:
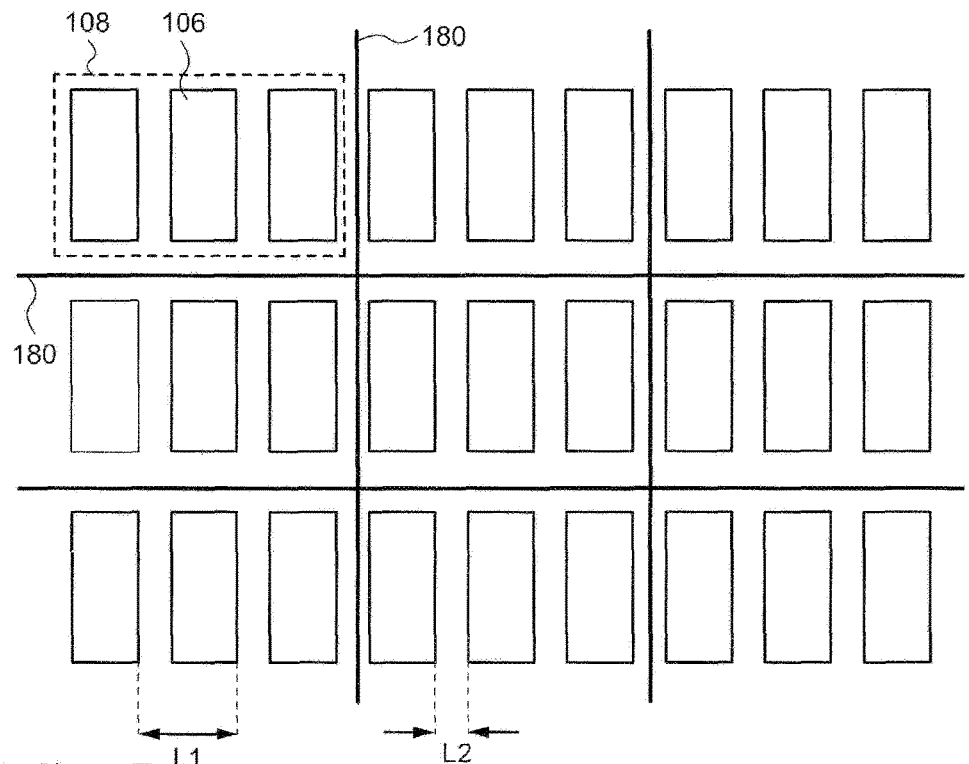
FIG. 2A and FIG. 2B are schematic top views of a display device according to an embodiment.

A schematic view of the display region 104 is shown in FIG. 2A. A pitch L1 of the sub-pixels 106 is preferably equal to or larger than 20 μm and equal to or smaller than 80 μm or equal to or larger than 30 μm and equal to or smaller than 50 μm. A distance L2 between the adjacent sub-pixels 106 is preferably equal to or larger than 5 μm and equal to or smaller than 30 μm or equal to or larger than 5 μm and equal to or smaller than 20 μm and is typically approximately 10 μm.

The display device 100 shown in the present embodiment has trenches 180 between the adjacent pixels 108. In the structure shown in FIG. 2A, the trenches 180 extend in a vertical direction and a lateral direction, that is, in a long-side direction and a short-side direction of the display device 100. The trenches 180 extending in the vertical direction and the lateral direction intersect each other. In the present embodiment, one pixel 108 is included in a minimum area demarcated by the trenches 180 intersecting each other. However, an embodiment of the present invention is not limited to this structure, and a plurality of pixels 108 may be included in a minimum area demarcated by the trenches 180 intersecting each other. This structure is explained in the Fourth Embodiment.

Figure 2B:
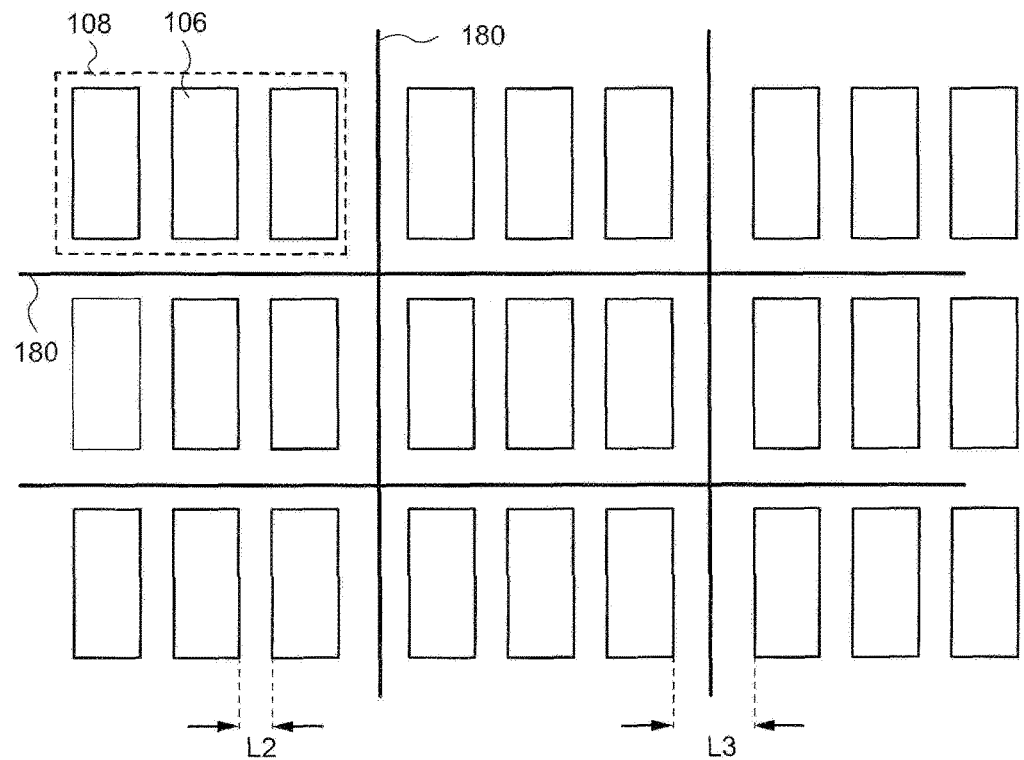

A distance between the adjacent sub-pixels 106 may be different between a region with the trench 180 and a region without the trench 180. For example, as shown in FIG. 2B, a distance L2 between the adjacent sub-pixels 106 in one pixel 108 may be smaller than a distance L3 between the adjacent sub-pixels 106 with the trench 180 sandwiched therebetween.

An enlarged schematic view of the pixel 108 is shown in FIG. 3. As shown in FIG. 3, in the display device 100 illustratively shown in the present embodiment, three sub-pixels 106 are provided in one sub-pixel 108. The pixel 108 possesses a signal line 120, a current-supplying line 122, and a gate line 124. Although not shown, the pixel 108 may have another wiring other than the signal line 120, the current-supplying line 122, and the gate line 124.

Each sub-pixel 106 is provided with two transistors respectively including semiconductor films 126 and 136. A projected portion of the gate line 124 (a portion protruding downward in the drawing) functions as a gate 128 of the transistor including the semiconductor film 126, whereas a projected portion of the signal line 120 (a portion protruding leftward in the drawing) functions as a source 130 of this transistor. A signal supplied from the signal line 120 is transmitted to a drain 132 through the semiconductor film 126. The drain 132 is connected to a first capacitor electrode 134 through a contact (a dotted circle in the drawing), and a part of the first capacitor electrode 134 (a portion protruding downward in the drawing) functions as a gate 138 of the transistor including the semiconductor film 136. A source 140 of this transistor is a projected portion of the current-supplying line 122 (a portion protruding rightward in the drawing), and a drain 142 also functions as a second capacitor electrode 160 opposing the first capacitor electrode 134. The drain 142 is electrically connected, through a contact, to a first electrode 144 which is one electrode of the light-emitting element. Note that the first electrode 144 is not illustrated in a part of the sub-pixels 106 in order to promote understanding. In the present embodiment, the sub-pixel 106 having two transistors and one capacitor is demonstrated as an example. However, the sub-pixel 106 may be further provided with another transistor or capacitor.

As shown in FIG. 3, one of the three signal lines 120 is electrically connected to a pixel circuit included in a corresponding sub-pixel 106 among the three sub-pixels 106. On the other hand, the gate line 124 is electrically connected to each of the pixel circuits included in the three sub-pixels 106.

The display device 100 of the present embodiment possesses a trench 180 between the pixels 108 adjacent to each other. For example, as shown in FIG. 3, the display device 100 has the trench 180 between the signal line 120 of one sub-pixel 106 in the pixel 108 and the current-supplying line 122 of one sub-pixel 106 in the adjacent pixel 108. Furthermore, the display device 100 has the trench 180 between two adjacent gate lines 124. The trenches 180 extend in a direction parallel to the signal lines 120, that is, a direction perpendicular to the gate lines 124 and intersects the gate lines 124. Similarly, the trenches 180 also extend in a direction perpendicular to the signal lines 120, that is, a direction parallel to the gate lines 124 and intersect the signal lines 120 and the current-supplying lines 122.

Figure 4:
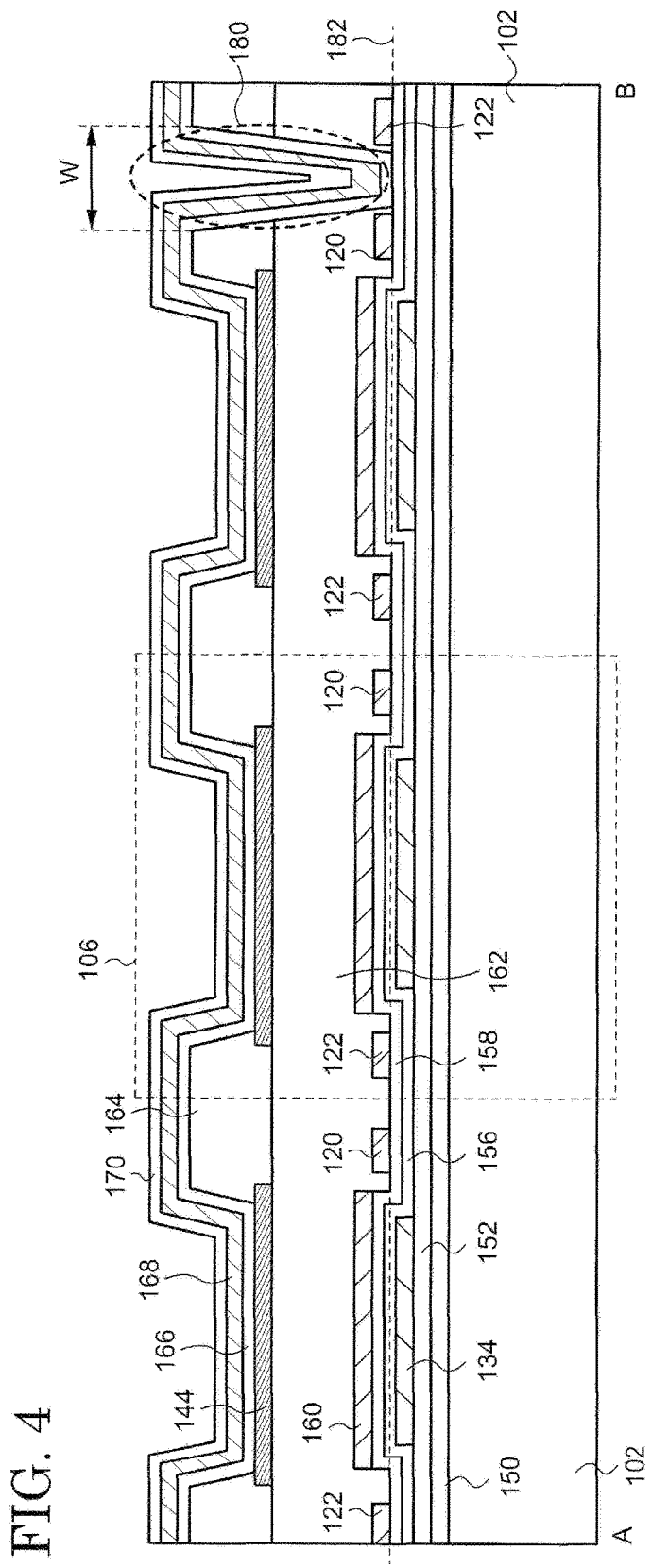
FIG. 4 is a schematic cross-sectional view of a display device according to an embodiment.

A schematic view of a cross section along a chain line A-B of FIG. 3 is shown in FIG. 4. The display device 100 possesses an undercoat 150 over the base material 102. The undercoat 150 is a film having a function to prevent impurities from being diffused to the semiconductor films 126 and 136 and the like from the base material 102.

The display device 100 further has a gate insulating film 152 over the undercoat 150. As described below, the gate insulating film 152 extends to the transistors in the sub-pixels 106 and overlaps with the gate 128. The first capacitor electrode 134 is disposed over the gate insulating film 152. As described below, the first capacitor electrode 134 is arranged in the same layer and has the same structure as the gate line 124.

A first interlayer insulating film 156 and a second interlayer insulating film 158 are provided over the first capacitor electrode 134. As described below, these films are formed over the gates 128 and 138 of the transistors in the sub-pixel 106 and have a function to protect the transistors. For example, a film including silicon nitride and a film including silicon oxide can be utilized as the first interlayer insulating film 156 and the second interlayer insulating film 158, respectively. In this case, the gate insulating film 152 is preferably a film including silicon oxide. This is because these films have a high barrier property, a large adhesion can be obtained between adjacent films, and a foreign object is not readily formed in processing. Note that the first interlayer insulating film 156 and the second interlayer insulating film 158 function as a dielectric film of the capacitor.

The signal lines 120, the current-supplying lines 122, and the second capacitor electrodes 160 are disposed over the second interlayer insulating film 158. These items may exist in the same layer.

The display device 100 further possesses a leveling film 162. The leveling film 162 has a function to absorb projections and depressions caused by each layer formed thereunder and provide a flat surface. The first electrode 144 of the light-emitting element is arranged over the leveling film 162.

A partition wall 164 is provided over the first electrode 144 so as to cover an edge portion of the first electrode 144. The partition wall 164 has a function to prevent an EL layer 166 and a passivation film 170 (also called a sealing film) formed thereover from being damaged by projections and depressions caused by the first electrode 144. Note that, in the present specification and claims, an EL layer is a layer constructing an EL element and means all the layers sandwiched between a pair of electrodes. Injection of carriers from a pair of electrodes causes recombination in an EL layer, and light-emission from an excited state generated by the recombination is obtained in a visible region.

Figure 5A:
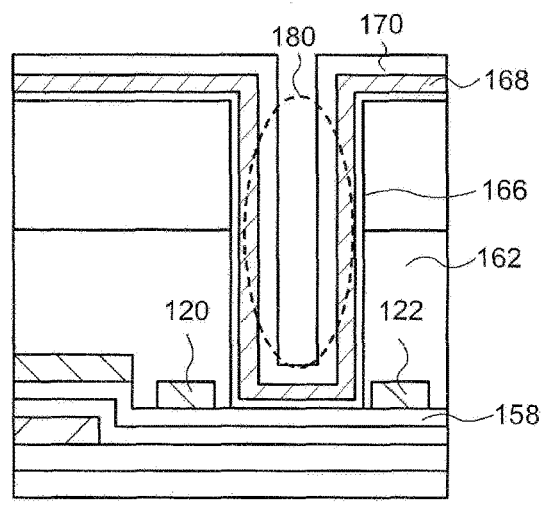
FIG. 5A to FIG. 5C are schematic cross-sectional views of a display device according to an embodiment.
Figure 5B:
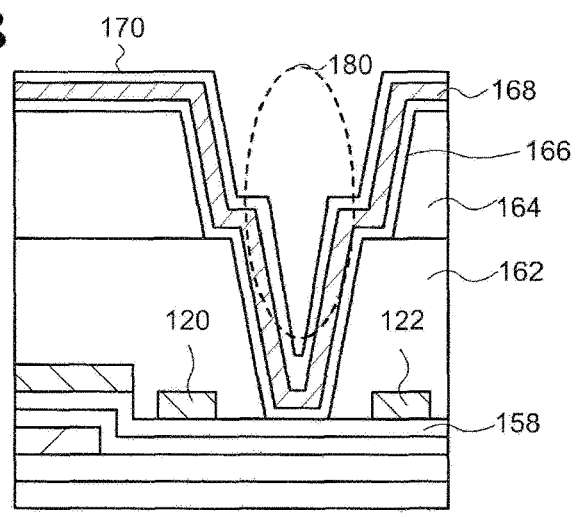
Figure 5C:
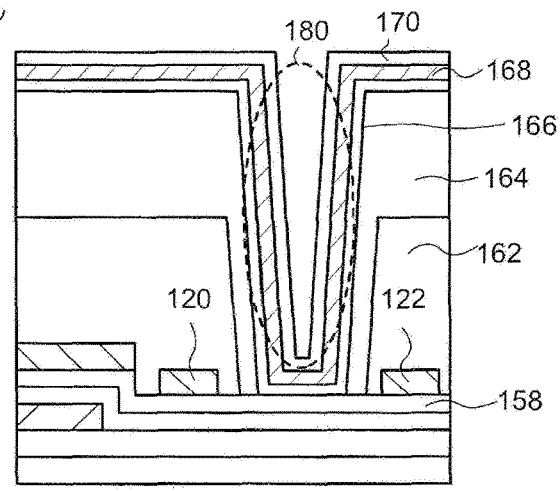

As shown in FIG. 4, an opening portion reaching the second interlayer insulating film 158 is formed in the leveling film 162 and the partition wall 164, and the opening portion corresponds to the trench 180. A width W of the trench 180 corresponds to a width of the opening portion at an upper surface of the partition wall 164 and is preferably equal to or larger than 0.5 μm and equal to or smaller than 5 μm, equal to or larger than 1 μm and equal to or smaller than 3 μm, or equal to or larger than 2 μm and equal to or smaller than 3 μm. In the display device 100 shown in FIG. 4, a side surface of the trench 180 provided by the partition wall 164 and a side surface of the trench 180 provided by the leveling film 162 exist in the same plane. Note that the side surface of the trench 180 is inclined from both of an upper surface and a normal line of the base material 102 in FIG. 4. However, the side surface of the trench 180 may be parallel to a normal line of the base material 102. Specifically, as shown in FIG. 5A, the side surface of the trench 180 may be parallel to a normal line of the base material 102. In this case, an area of a bottom of the trench 180 is substantially the same as an area of the opening portion of the partition wall 164. In contrast, the side surface of the trench 180 may have a step as shown in FIG. 5B. In this case, an area of the opening portion of the leveling film 162 at its upper surface is smaller than an area of a bottom of the partition wall 164 in the trench 180. Alternatively, the trench 180 may have a structure in which the partition wall 164 covers the side surface of the opening portion of the leveling film 162 as shown in FIG. 5C. In this case, a part of the partition wall 164 is in contact with the second interlayer insulating film 158.

Referring to FIG. 4, the display device 100 further has the EL layer 166 and a second electrode 168 over the first electrode 144 and the partition wall 164. The light-emitting element is constructed by the first electrode 144, the EL layer 166, and the second electrode 168. The EL layer 166 is in contact with the second interlayer insulating film 158 via the trench 180.

The EL layer 166 is illustrated so as to have a single-layer structure in FIG. 4. However, the EL layer 166 may possess a structure in which a plurality of layers including different materials are stacked. For example, a charge-injection layer, a charge-transporting layer, an emission layer, a charge-blocking layer, and the like may be stacked as appropriate.

Figure 6:
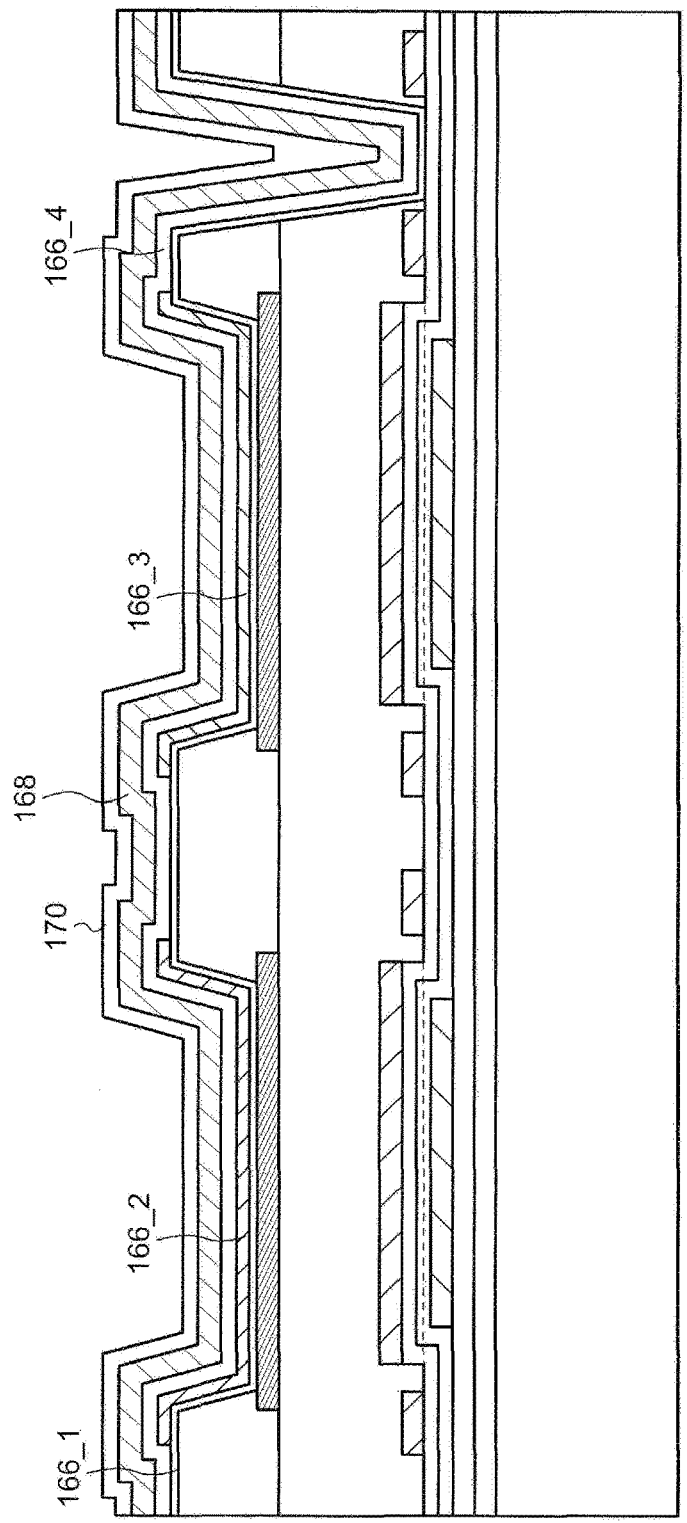
FIG. 6 is a schematic cross-sectional view of a display device according to an embodiment.

An enlarged figure of a part of FIG. 4 is shown in FIG. 6. When emission colors different between adjacent sub-pixels 106 are obtained, layers 166_1 and 166_4 other than emission layers 166_2 and 166_3 may be formed as common layers so as to be shared by the adjacent sub-pixels 106 and the trench 180 as shown in FIG. 6. A hole-injection layer, a hole-transporting layer, an electron-injection layer, an electron-transporting layer, and the like are represented as the layers 166_1 and 166_4. The emission layers 166_2 and 166_3 different from each other are respectively provided in the adjacent sub-pixels 106, and the emission layers 166_2 and 166_3 are sandwiched between the layers 166_1 and 166_4. When the EL layer 166 is formed in such a configuration, the layer in contact with the second interlayer insulating film 158 in the trench 180 is the layer 166_1. Hence, the structure of the EL layer 166 in the trench 180 is different from that in each sub-pixel 106. The second electrode 168 can possess the same structure as the first electrode 144.

Referring to FIG. 4, the passivation film 170 for protecting the light-emitting element is provided over the second electrode 168.

Although not shown, a color filter, a light-shielding film, a substrate (opposing substrate) opposing the base material 102, and the like may be arranged as an optional structure over the second electrode 168 or the passivation film 170. When an opposing substrate is provided, a space between the base material 102 and the opposing substrate may be filled with an organic resin as a filler or an inert gas. When a filler is provided, the filler is included inside the trench 180. Note that a dotted line 182 in FIG. 4 is a center line and indicates a position at a half thickness of the display device 100. Here, the dotted line 182 points to a middle position between a bottom surface of the base material 102 and a top surface of the passivation film 170. In an embodiment of the present invention, it is preferred that a thickness of each layer such as the base material 102, the partition wall 164, and the leveling film 162 be controlled so that the center line 182 is located at or near the bottom surface of the trench 180 (i.e., a top surface of the second interlayer insulating film 162) as shown in FIG. 4.

Figure 7:
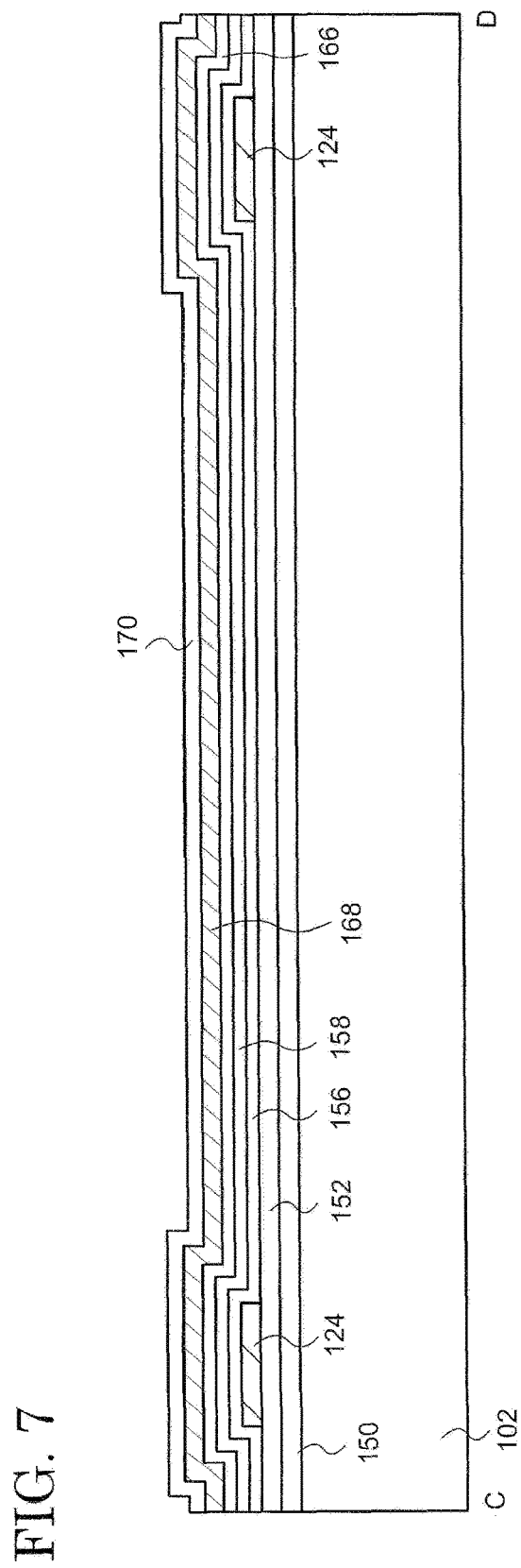
FIG. 7 is a schematic cross-sectional view of a display device according to an embodiment.

A schematic cross-sectional view along the trench 180, that is, a cross-sectional view along a chain line C-D shown in FIG. 3 is illustrated in FIG. 7. As shown in FIG. 7, the undercoat 150, the gate insulating film 152, the gate line 124, the first interlayer insulating film 156, the second interlayer insulating film 158, the EL layer 166, the second electrode 168, and the passivation film 170 are provided over the base material 102 in this order in a region in which the trench 180 is located. Hence, in the trench 180, the leveling film 162 and the partition wall 164 are not formed, and the second interlayer insulating film 158 is in contact with the EL layer 166.

Figure 8:
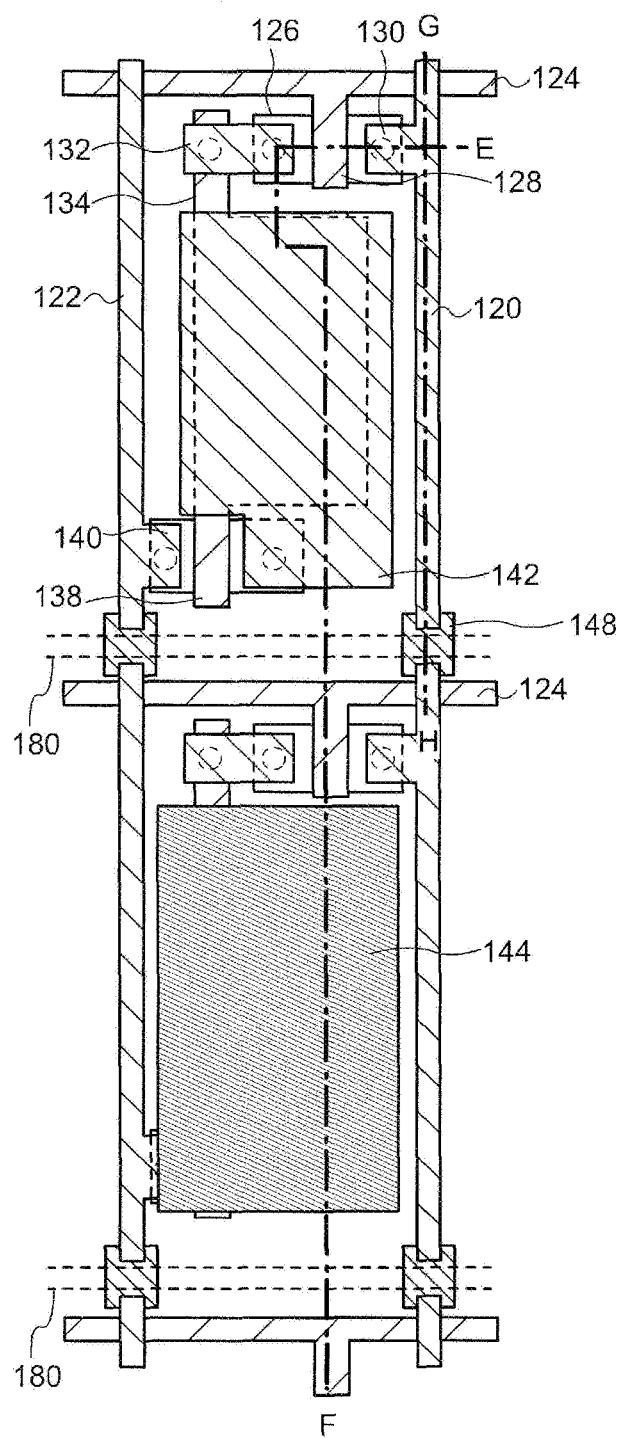
FIG. 8 is a schematic top view of a display device according to an embodiment.
Figure 9:
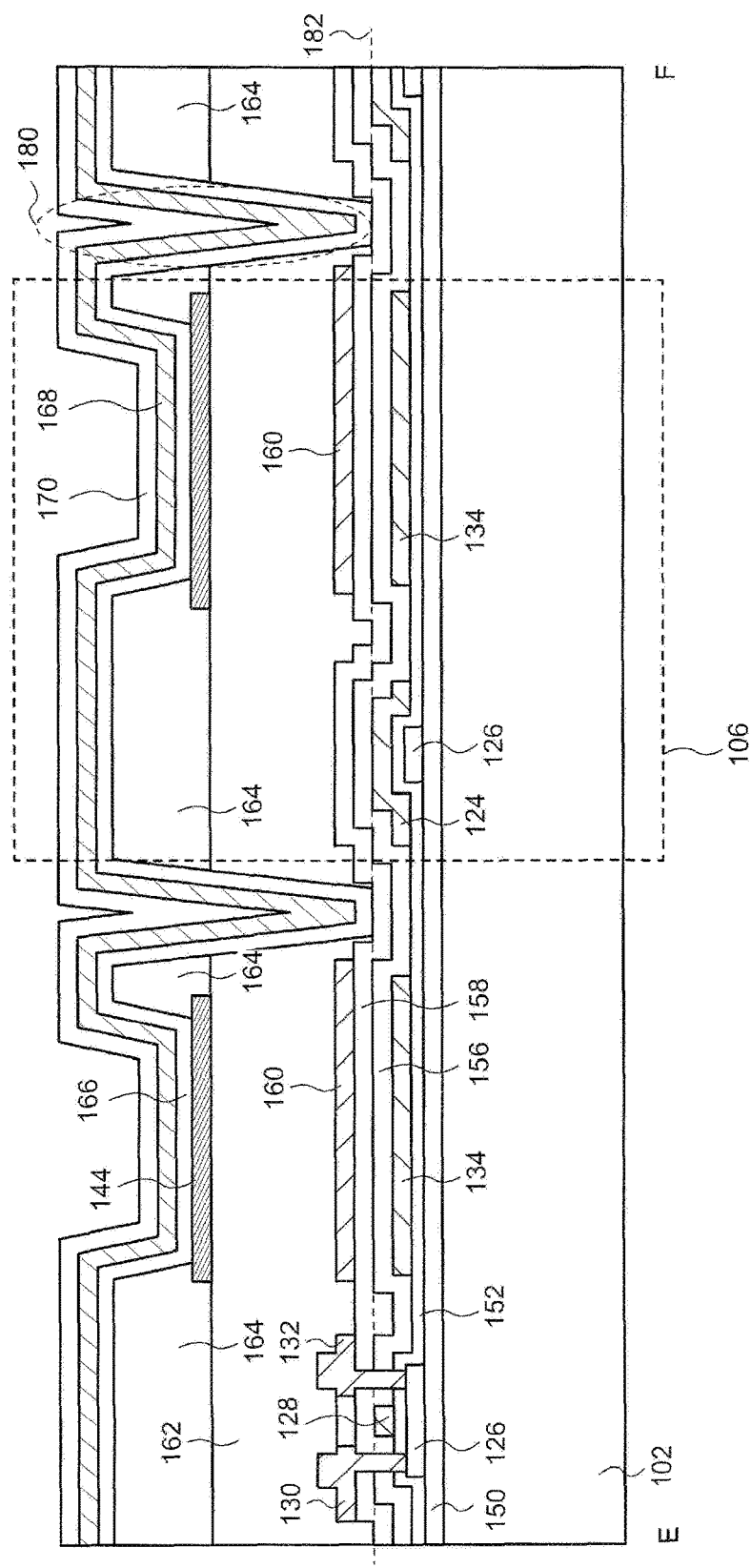
FIG. 9 is a schematic cross-sectional view of a display device according to an embodiment.

The two sub-pixels 106 formed so as to sandwich the gate line 124 are shown in FIG. 8. A cross-sectional view along a broken line E-F of this figure is shown in FIG. 9. Note that the first electrode 144 of one of the sub-pixels 106 is also not illustrated in FIG. 8

The sub-pixel 106 includes the transistor which possesses the semiconductor film 126, the gate insulating film 152, and the gate 128 as shown in FIG. 9. The sub-pixel 106 further has the first interlayer insulating film 156 and the second interlayer insulating film 158 over the transistor, and the source 130 and the drain 132 are arranged thereover. The source 130 and the drain 132 are electrically connected to the semiconductor film 126 through the contacts formed in the first interlayer insulating film 156, the second interlayer insulating film 158, and the gate insulating film 152. Note that the transistor of a top-gate type is illustrated in FIG. 9. However, the transistor may be a bottom-gate type. Additionally, the transistor may be an N-channel-type transistor or a P-channel-type transistor.

Figure 10A:
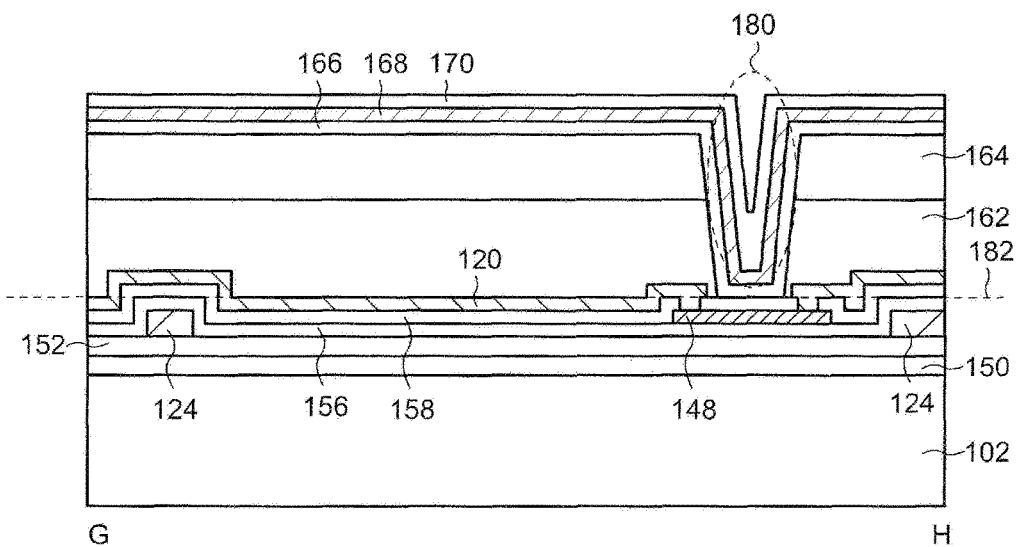
FIG. 10A and FIG. 10B are schematic cross-sectional views of a display device according to an embodiment.
Figure 10B:
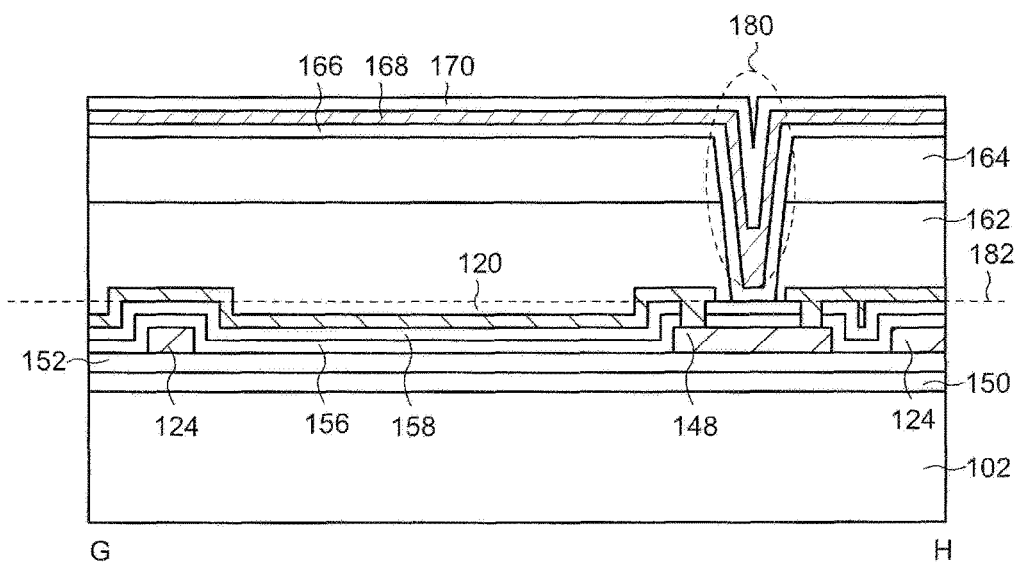

Cross-sectional views along the signal line 120, that is, cross-sectional views along a chain line G-H of FIG. 8 are shown in FIG. 10A and FIG. 10 B. As shown in FIG. 10A and FIG. 10B, the display device 100 possesses, over the base material 102, the undercoat 150, the gate insulating film 152, the gate line 124, the first interlayer insulating film 156, and the second interlayer insulating film 158 in this order. The signal line 120 is provided over the second interlayer insulating film 158.

The trench 180 shown in FIG. 8 extends in a direction parallel to the gate line 124 and intersects the signal line 120 and the current-supplying line 122. In a region in which the trench 180 and the signal line 120 intersect each other, the signal line 120 may be physically disconnected and the divided signal lines 120 can be electrically connected to each other via a connection electrode 148. The same is applied to the current-supplying line 122, and the current-supplying line 122 may be disconnected in a region overlapping with the trench 180, and the divided current-supplying lines 122 can be electrically connected to each other via the connection electrode 148. A schematic cross-sectional view along a chain line G-H of FIG. 8 is shown in FIG. 10A. As shown in FIG. 10A, the connection electrode 148 may be arranged between the first interlayer insulating film 156 and the second interlayer insulating film 158, and the divided signal lines 120 can be electrically connected to the connection electrode 148 through contacts formed in the second interlayer insulating film 158, for example. In this case, a top surface of the connection electrode 148 is covered with the second interlayer insulating film 158.

On the other hand, as shown in FIG. 10B, the connection electrode 148 may exist in the same layer as the gate line 124. Namely, both of the gate line 124 and the connection electrode 148 may be formed so as to be sandwiched by the gate insulating film 152 and the first interlayer insulating film 156. In this case, the divided signal lines 120 are connected to the connection electrode 148 through the opening portion formed in the first interlayer insulating film 156 and the second interlayer insulating film 158. Note that it is not always necessary to disconnect the signal line 120 and the current-supplying line 122, and these lines may be continuously formed through the two sub-pixels 106 with the trench 180 interposed therebetween.

The trench 180 is formed by performing an etching treatment on the partition wall 164 and the leveling film 162 simultaneously or individually. When the signal line 120 is not disconnected, the signal line 120 may be exposed to an etchant in the etching treatment, resulting in oxidation of a surface of the signal line 120. However, the connection electrode 148 is formed, and a top surface thereof is covered with the first interlayer insulating film 156 and/or the second interlayer insulating film 158, thereby preventing the signal line 120 from being exposed to an etchant in the etching treatment. Furthermore, it is possible to avoid direct contact of the signal line 120 with the EL layer 166.

As described above, the use of a flexible base material 102 provides flexibility to the display device 100. In this case, deformation of the display device 100 by folding or bending results in stress on the elements such as the light-emitting element, the transistors, and the capacitor provided in the sub-pixel 106. Large stress on the sub-pixel 106 causes peeling at an interface with low adhesion, such as an interface between the EL layer 166 and the first electrode 144, an interface between the EL layer 166 and the second electrode 168, and an interface between the second electrode 168 and the passivation film 170, leading to destruction of the light-emitting elements. Moreover, peeling may also take place at interfaces between the films structuring the transistors and the capacitor or cracks may be caused in these films.

Figure 11:
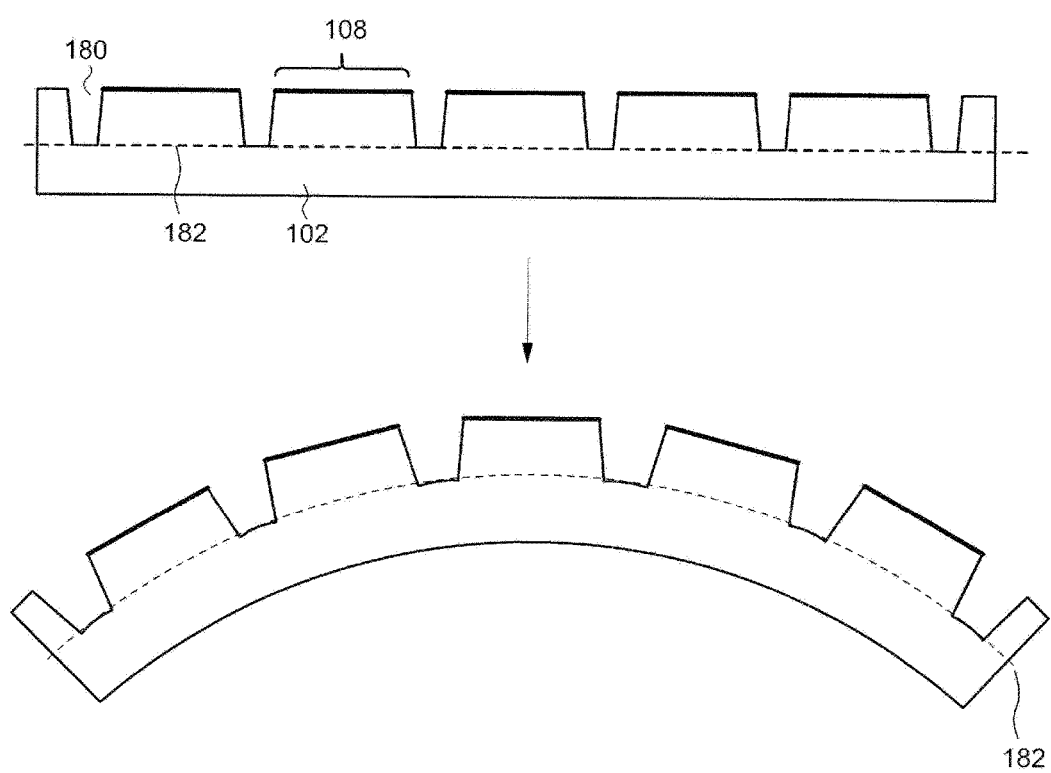
FIG. 11 is a schematic cross-sectional view of a display device according to an embodiment.

However, even when the display device 100 is deformed, the trench 180 mainly supports the weight of deformation, thereby reducing the amount of deformation of the sub-pixel 106. Specifically, as shown in FIG. 11, when the display device 100 is bent so that the upper surface of the base material 102 over which the display region 104 is provided is positioned outside with respect to the lower surface, the opening portion of the trench 180 is expanded because the region in which the trench 180 is provided has a relatively small thickness. That is, although the shape of the trench 180 is changed upon the deformation of the display device 100, the deformation of the pixel 108 including the light-emitting element and the transistors is suppressed. Hence, stress on the light-emitting element and the transistors is reduced, leading to improvement of reliability of the display device 100.

Furthermore, when the adjacent pixels 108 or sub-pixels 106 share the EL layer 166 or a part of the EL layer 166 as shown in FIG. 4 and FIG. 6, a current may flow in a lateral direction (a direction parallel to the surface of the base material 102) in the EL layer 166, and a current injected to one sub-pixel 106 may flow in the adjacent sub-pixel 106. This phenomenon is called crosstalk and cannot be neglected in the case where the EL layer 166 contains a layer with a relatively high conductivity and a distance between the sub-pixels 106 is small. However, by forming the trench 180, the EL layer 166 becomes longer between the sub-pixels 106 adjacent with each other with the trench 180 sandwiched therebetween. Therefore, resistance of the EL layer 166 in the lateral direction is increased, and crosstalk can be effectively suppressed. As a result, decrease in quality of an image reproduced in the display region 104 can be avoided.

<Second Embodiment>

Figure 12:
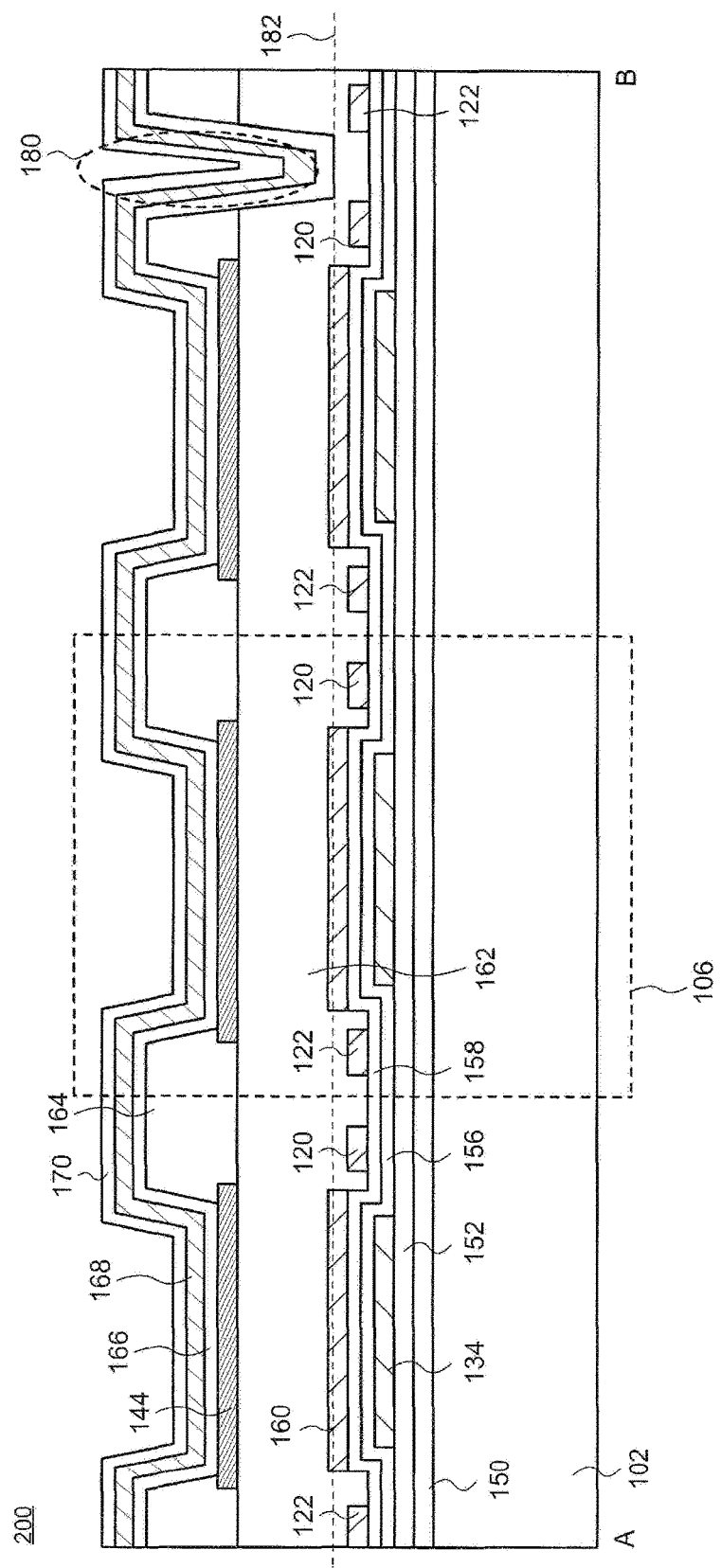
FIG. 12 is a schematic cross-sectional view of a display device according to an embodiment.

In the present embodiment, a display device of an embodiment of the present invention is explained by using FIG. 12. Description of the structures which are the same as those of the First Embodiment may be omitted.

A schematic cross-sectional view of a display device 200 of the present embodiment is shown in FIG. 12. Note that this schematic cross-sectional view corresponds to the cross-section along the chain line A-B of FIG. 3. As shown in FIG. 12, a part of the leveling film 162 is left in a lower portion of the trench 180. Therefore, the EL layer 166 is in contact with the bottom surface of the trench 180, that is, the leveling film 162, and a thickness of the leveling film 162 in the trench 180 is smaller than that in the sub-pixel 106. Such a structure can be realized by controlling the conditions of the etching process for forming the trench 180 as appropriate. Alternatively, this structure can be realized by fabricating the leveling film 162 by stacking two layers having different etching rates.

In such a structure, the signal line 120 and the current-supplying line 122 are not exposed when the trench 180 is formed, and the oxidation of their surfaces can be avoided without forming the connection electrode 148 described in the First Embodiment. Moreover, this structure is effective as a method for placing the bottom surface of the trench 180 close to the center line 182 when a thickness of the base material 102 is small and the center line 182 is located closer to the light-emitting element.

<Third Embodiment>

Figure 13:
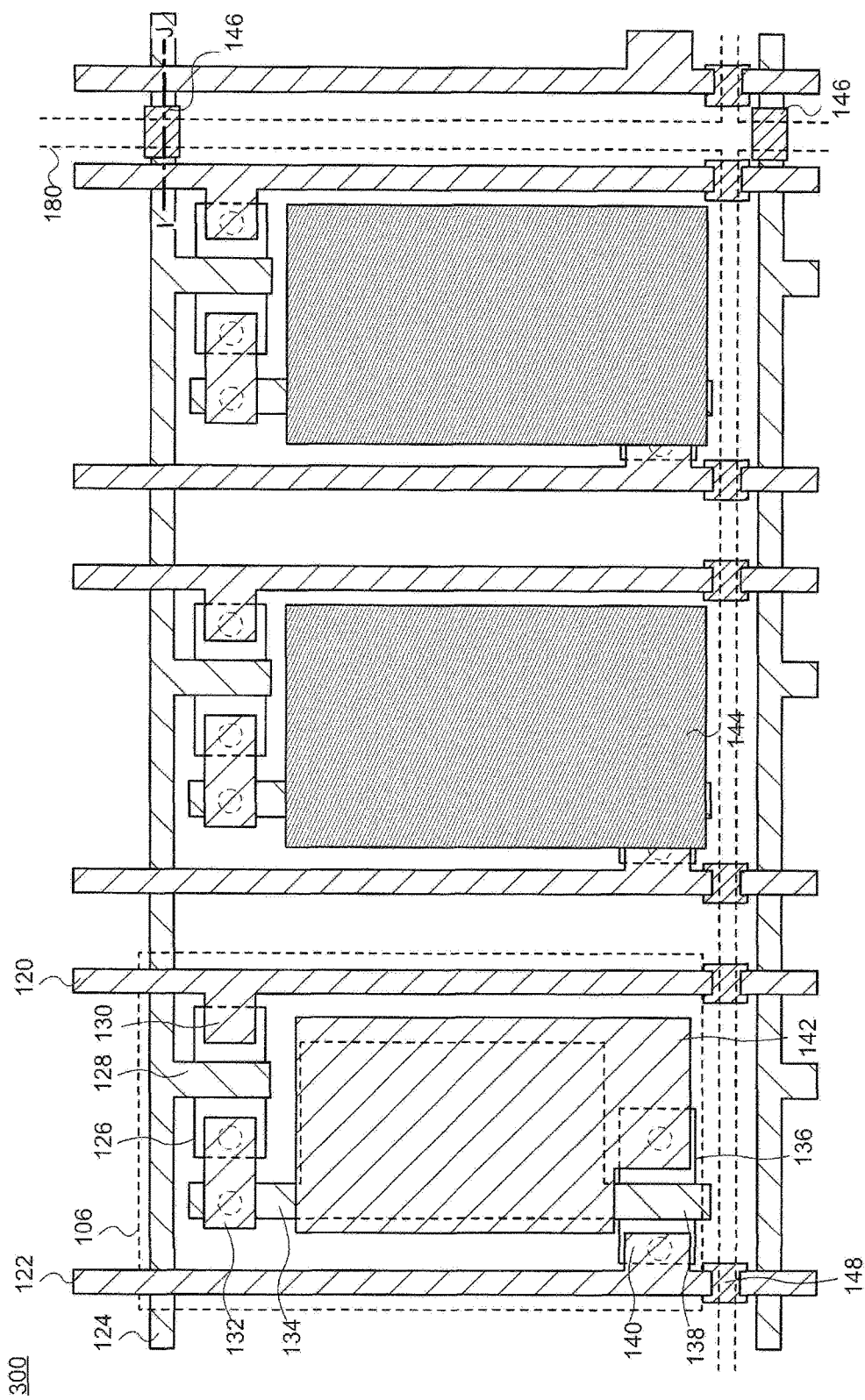
FIG. 13 is a schematic top view of a display device according to an embodiment.
Figure 14:
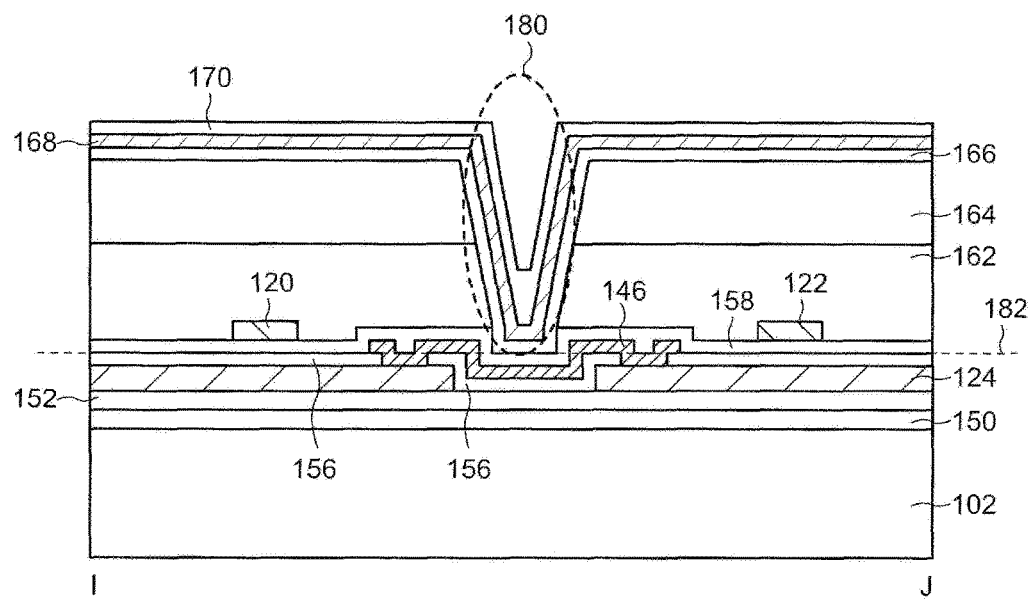
FIG. 14 is a schematic cross-sectional view of a display device according to an embodiment.

In the present embodiment, a display device of an embodiment of the present invention is explained by using FIG. 13 and FIG. 14. Description of the structures which are the same as those of the First and Second Embodiments may be omitted.

A top view of a display device 300 of the present embodiment is shown in FIG. 13. Similar to the First Embodiment, a mode is described as an example in which the pixel 108 has three sub-pixels 106 in this embodiment. In the display device 300, the gate line 124 is disconnected in a region overlapping with the trench 180, and the two divided gate lines 124 are electrically connected to each other via the connection electrode 146.

More specifically, as shown in a schematic cross-sectional view (FIG. 14) along a chain line I-J of FIG. 13, the gate line 124 provided over the undercoat 150 and the gate insulating film 152 is disconnected in the region overlapping with the trench 180. The first interlayer insulating film 156 is formed over the divided gate lines 124, and the first interlayer insulating film 156 possesses opening portions exposing the gate line 124. The connection electrode 146 is arranged over the first interlayer insulating film 156, and the two divided gate lines 124 are electrically connected to each other through the aforementioned opening portions. The second interlayer insulating film 158 is formed over the connection electrode 146, and the signal line 120 and the current-supplying line 122 are provided thereover. In such a structure, the center line 182 can be placed at or close to the bottom surface of the trench 180 by controlling a thickness of the connection electrode 146, by which increased durability to deformation can be provided to a display device.

<Fourth Embodiment>

In the present embodiment, a display device of an embodiment of the present invention is explained by using FIG. 15 to FIG. 18. Description of the structures which are the same as those of the First to Third Embodiments may be omitted.

Figure 15:
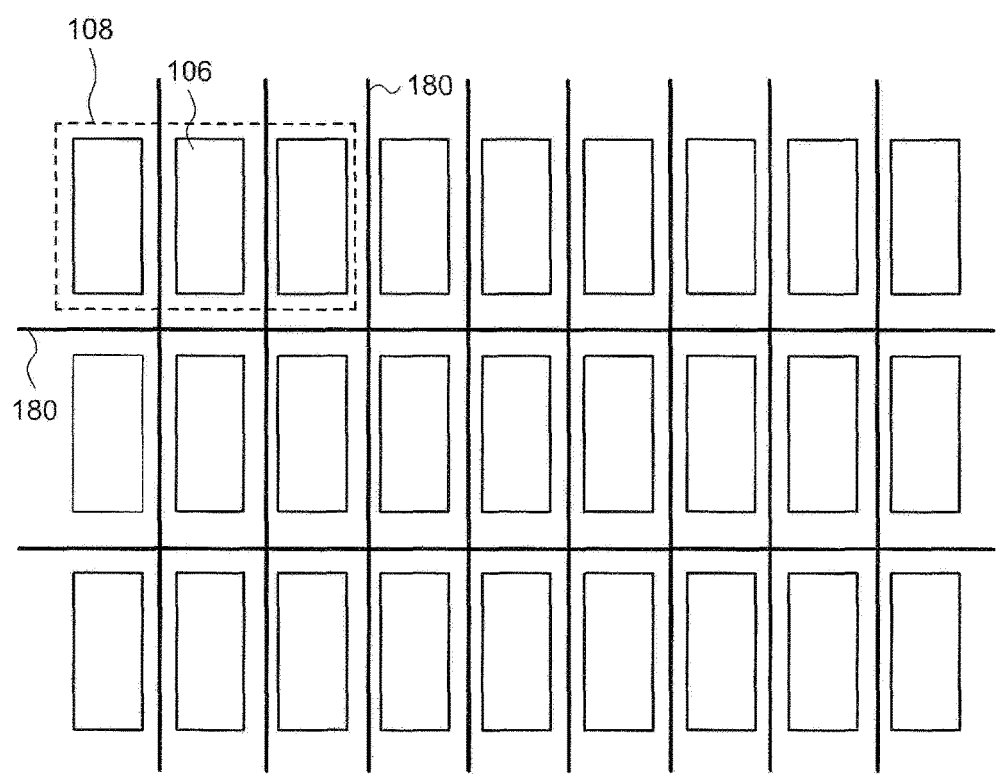
FIG. 15 is a schematic top view of a display device according to an embodiment.

In the display device 100 of the First Embodiment, one pixel 108 having a plurality of sub-pixels 106 is included in a minimum area demarcated by the trenches 180 intersecting each other (see FIG. 2A and FIG. 2B). On the other hand, a display device of the present embodiment has one sub-pixel 106 in a minimum area demarcated by the trenches 180 intersecting each other as shown in FIG. 15. Employment of such a structure allows production of a display device which is readily deformed and has increased durability to deformation because of an increase in contribution of the portion undergoing deformation in the deformation of the display device. Additionally, all of the sub-pixels 106 possess the trench 180 between the adjacent sub-pixel 106 and the sub-pixel 106, thereby effectively preventing crosstalk.

Figure 16:
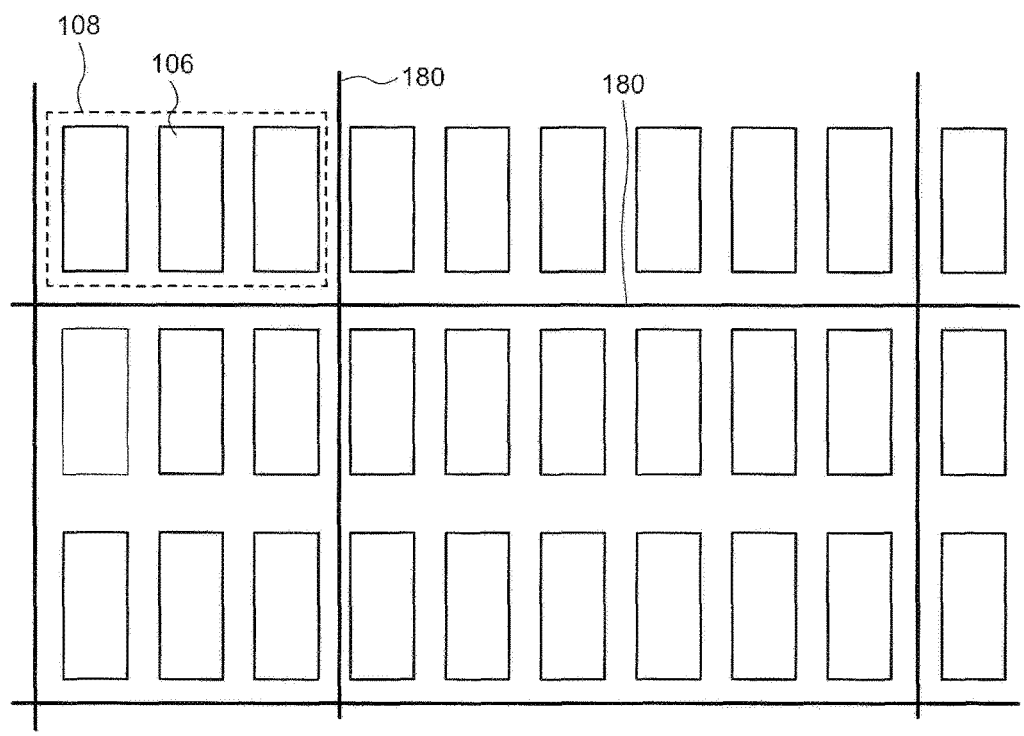
FIG. 16 is a schematic top view of a display device according to an embodiment.
Figure 17:
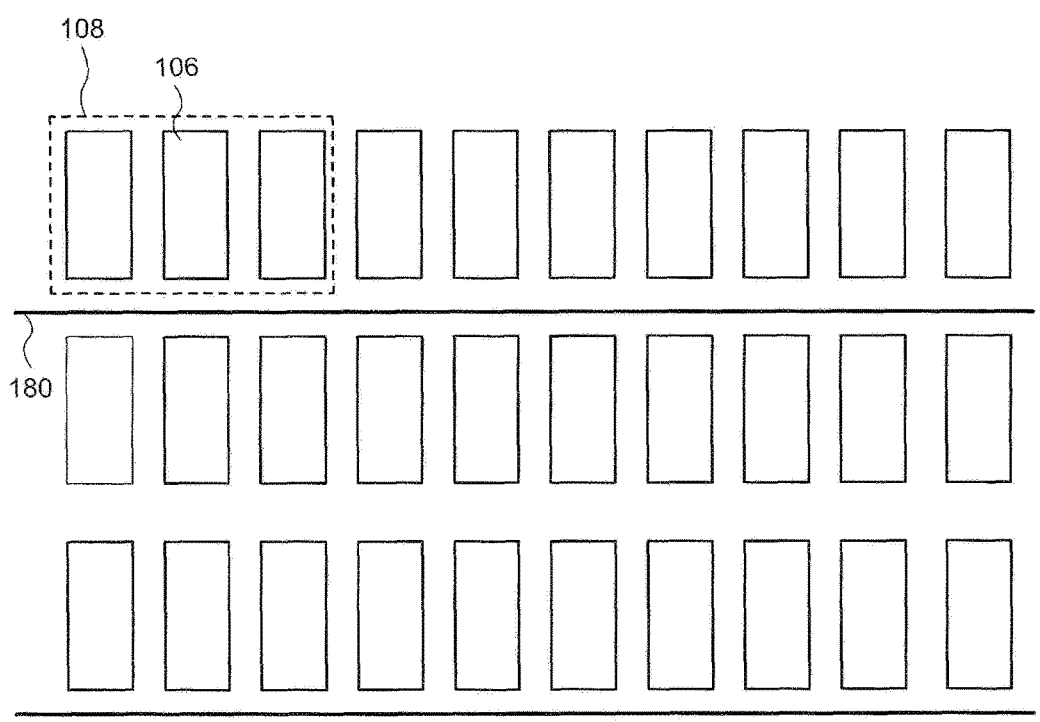
FIG. 17 is a schematic top view of a display device according to an embodiment.
Figure 18:
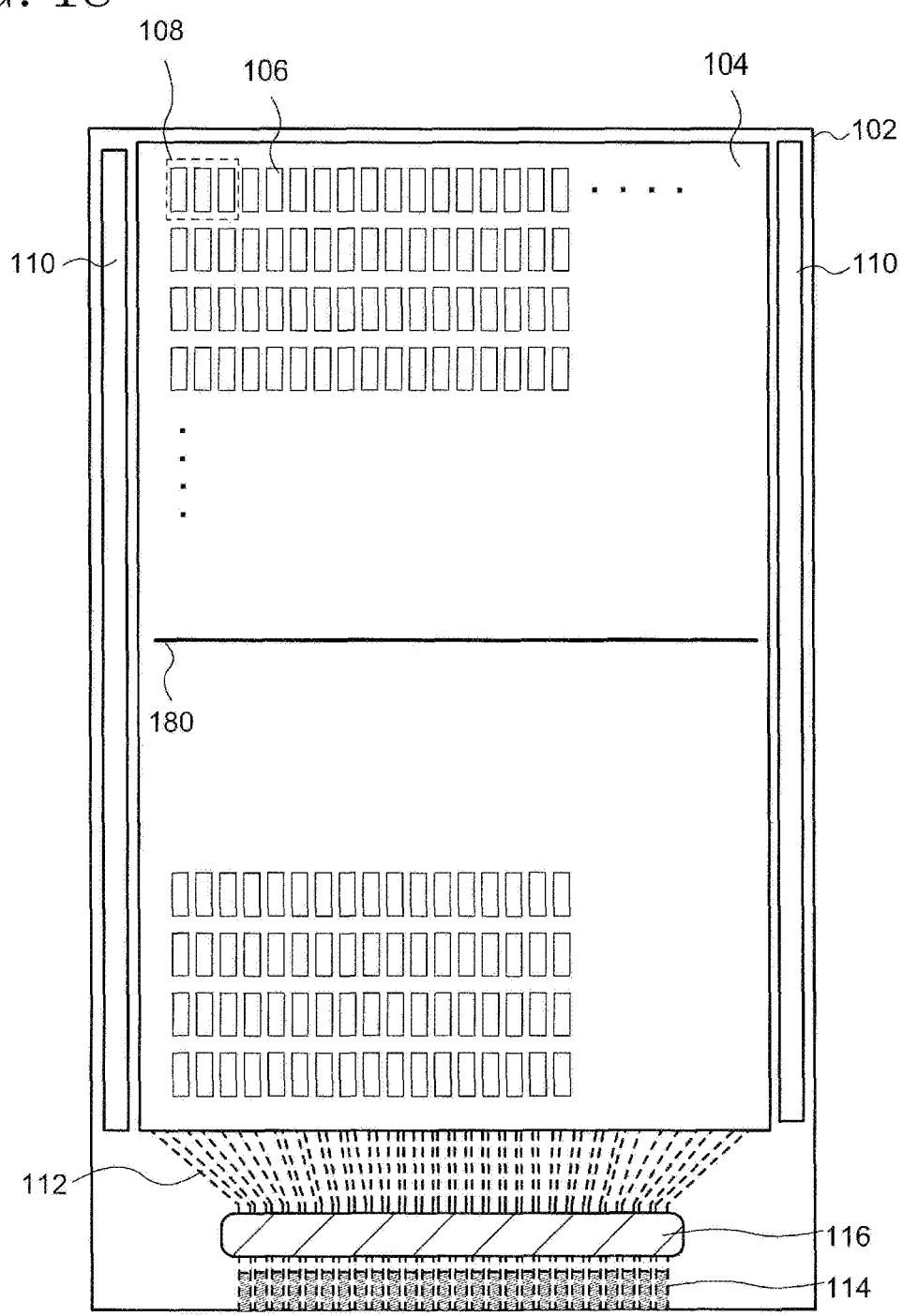
FIG. 18 is a schematic top view of a display device according to an embodiment.

Alternatively, the display device of the present embodiment may have a plurality of pixels 108 in a minimum area demarcated by the trenches 180 intersecting each other as shown in FIG. 16. Furthermore, the number of the pixels 108 included in the minimum area may be varied. That is, the trenches 180 may be configured so as to surround the plurality of pixels 108 or the plurality of sub-pixels 106 or may be configured to demarcate some pixels of the plurality of pixels 108 in an island shape or some sub-pixels of the plurality of sub-pixels 106 in an island shape. Alternatively, the trenches 180 may be provided so as not to intersect each other but extend in only one direction as shown in FIG. 17. In FIG. 17, the trenches 180 are formed in only a direction parallel to the gate lines 124, and no trench parallel to the signal lines 120 is provided. Alternatively, as shown in FIG. 18, the display device may have a structure in which several numbers (e.g., equal to or larger than 1 and equal to 10 or smaller than 10) of trenches are included in one display region 104.

Employment of such structures allows the flexibility of the whole of the display device to be adjusted and the flexibility to be appropriately tuned depending on a direction or location of the deformation.

<Fifth Embodiment>

Figure 19:
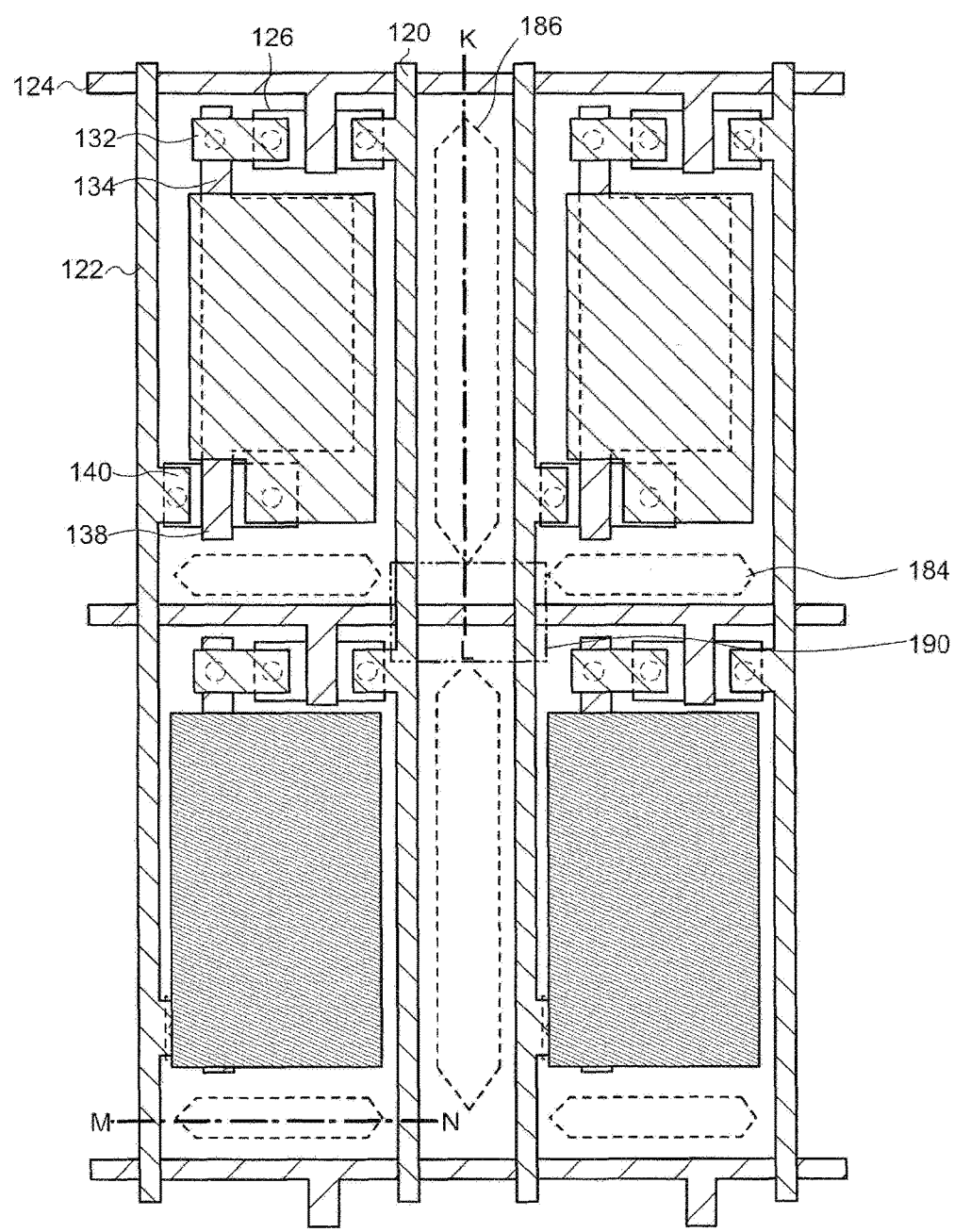
FIG. 19 is a schematic top view of a display device according to an embodiment.
Figure 20:
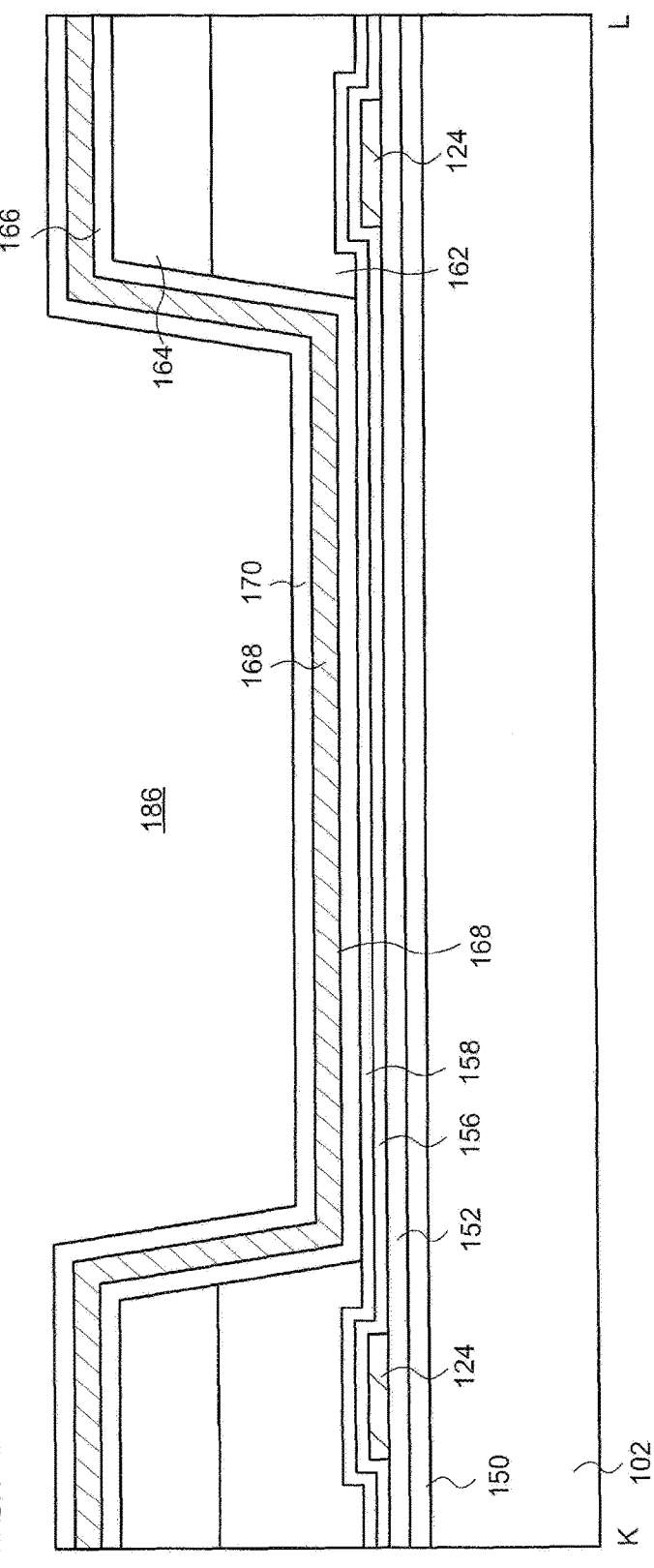
FIG. 20 is a schematic cross-sectional view of a display device according to an embodiment.
Figure 21:
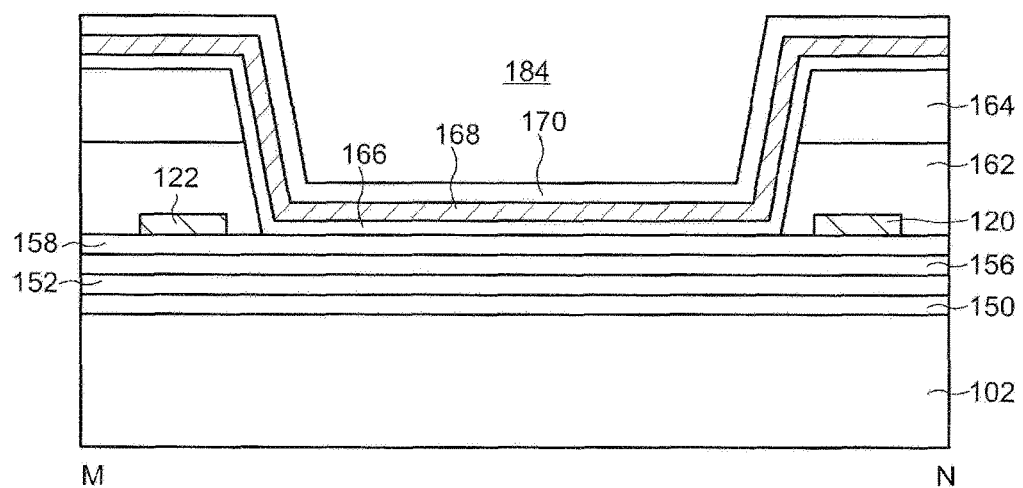
FIG. 21 is a schematic cross-sectional view of a display device according to an embodiment.

In the present embodiment, a display device of an embodiment of the present invention is explained by using FIG. 19 to FIG. 21. Description of the structures which are the same as those of the First to Fourth Embodiments may be omitted.

A top view of a display device 400 of the present embodiment is shown in FIG. 19. In the display device 100 of the First Embodiment, the trenches extend in both directions parallel and perpendicular to the gate lines 124 and intersect the gate lines 124 and the signal lines 120. On the other hand, in the display device 400 of the present embodiment, the trenches 180 extend in both directions parallel and perpendicular to the gate lines 124 but do not intersect the gate lines 124 and the signal lines 120 as shown in FIG. 19. That is, the trenches 180 are divided in a region overlapping with the gate lines 124 and the signal lines 120. More specifically, the display device 400 possesses a trench 184 which extends in a direction parallel to the gate lines 124 but does not intersect the signal lines 120 and a trench 186 which extends in a direction perpendicular to the gate lines 124 but does not intersect the gate line 124. Note that the first electrode 144 is not illustrated in a part of the sub-pixels 106 in order to promote understanding.

This structure is explained in detail by using schematic cross-sectional views (FIG. 20, FIG. 21) along chain lines K-L and M-N of FIG. 19. As shown in FIG. 20, in a region provided with the trench 186, the display device 400 has the base material 102, the undercoat 150 formed thereover, the gate insulating film 152, the gate line 124, the first interlayer insulating film 156, the second interlayer insulating film 158, the leveling film 162, and the partition wall 164 in this order. The leveling film 162 and the partition wall 164 have an opening portion between the two gate lines 124, and this opening portion corresponds to the trench 186. The EL layer 166 is in contact with the second interlayer insulating film 158 via the trench 186, and the second electrode 168 of the light-emitting element and the passivation film 170 are formed over the EL layer 166.

Referring to FIG. 21, in a region provided with the trench 184, the display device 400 has the base material 102, the undercoat 150 formed thereover, the gate insulating film 152, the first interlayer insulating film 156, the second interlayer insulating film 158, the signal line 120, the current-supplying line 122, the leveling film 162, and the partition wall 164 in this order. The leveling film 162 and the partition wall 164 have an opening portion between the signal line 120 and the current-supplying line 122, and this opening portion corresponds to the trench 184. The EL layer 166 is in contact with the second interlayer insulating film 158 via the trench 184, and the second electrode 168 of the light-emitting element and the passivation film 170 are formed over the EL layer 166.

The second electrode 168 of the light-emitting element is formed over the whole surface of the display region 104 and is shared by each sub-pixel 106. Thus, when a resistance of the second electrode 168 is relatively high, e.g., when a light-transmitting conductive oxide is included in the second electrode 168, a voltage drop caused by the resistance of the second electrode 168 becomes prominent with increasing area of the display region 104, resulting in unevenness of emission luminance. Moreover, since a conduction route provided by the second electrode 168 passes through the trench 180 in the display device 100 of the First Embodiment, the conductive route is prolonged compared with a case where the trench 180 is not formed and the voltage drop becomes more serious. However, the use of the structure of the display device 400 secures a conduction route (e.g., a region 190 and the like in FIG. 19) which does not pass through the trenches 184 and 186 between the adjacent sub-pixels 106. Namely, a region where the trenches 184 and 186 are not provided has a shorter conduction route. Hence, the voltage drop resulting from the resistance of the second electrode can be relieved, and the unevenness of luminance can be decreased.

<Sixth Embodiment>

Figure 22:
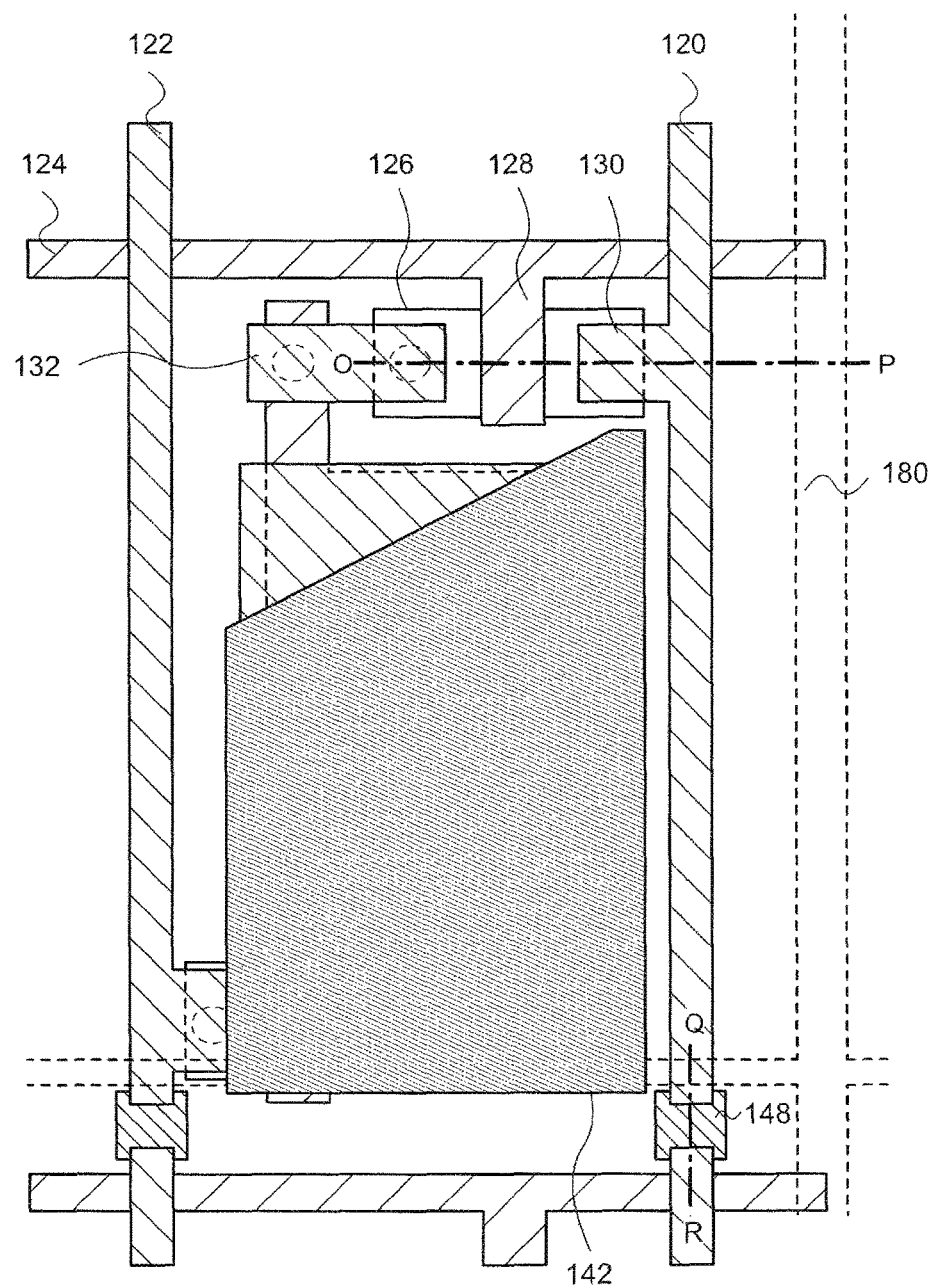
FIG. 22 is a schematic top view of a display device according to an embodiment.

In the present embodiment, a manufacturing method of the display device 100 explained in the First Embodiment is explained by using FIG. 22 to FIG. 25B. FIG. 22 is a top view of one sub-pixel 106 of the pixel 108 shown in FIG. 3. Cross-sectional views along chain lines O-P and Q-R of FIG. 22 are shown in FIG. 23A to FIG. 25B.

As shown in FIG. 23A, the undercoat 150 is formed over the base material 102 over which the semiconductor film 126 is formed. As the base material 102, a material with relatively high physical strength, such as glass, quartz, and a metal, can be used, for example. When flexibility is provided to the display device 100, a polymer material such as a polyimide, a polyamide, an acrylic resin, a polycarbonate, and a polyester is used, and a thickness may be selected so as to give flexibility.

The undercoat 150 may include an inorganic compound such as silicon nitride, silicon oxide, silicon nitride oxide, and silicon oxynitride and can be formed by applying a chemical vapor deposition (CVD) method, a sputtering method, and the like.

The semiconductor 126 includes a material exhibiting semiconductor properties, such as silicon, germanium, or an indium-based oxide semiconductor and may be formed by using a CVD method, a sputtering method, or the like. Crystallinity of the semiconductor film 126 is also not limited, and the semiconductor film 126 may have a single-crystalline, polycrystalline, microcrystalline, amorphous morphology, or the like.

Next, the gate insulating film 152 is formed over the semiconductor film 126 over which the gate 128 is formed (FIG. 23B). The gate insulating film 152 can also be prepared with a material and a method which are the same as those of the undercoat 150 and preferably contains silicon oxide. The undercoat 150 and the gate insulating film 152 each may have a single-layer structure or a stacked-layer structure including a plurality of layers. The gate 128 can be formed by using a metal such as titanium, aluminum, copper, molybdenum, tungsten, and tantalum and an alloy thereof in a single-layer or stacked-layer structure. For example, a stacked layer can be employed in which aluminum or copper is sandwiched by titanium or molybdenum. As a formation method, a sputtering method, a CVD method, a printing method, or the like is represented. Note that, as shown in FIG. 22, the first capacitor electrode 134 in addition to the gate line 124 are also simultaneously formed when the gate 128 is formed.

After forming the gate 128, the first interlayer insulating film 156 is formed. The first interlayer insulating film 156 may be formed with a material and a method which are the same as those of the undercoat 150 and preferably contains silicon nitride.

Next, the connection electrode 148 is formed over the first interlayer insulating film 156. The connection electrode 148 can be formed with a material usable for the gate 128 by applying a CVD method or a sputtering method. The connection electrode 148 may possess any of a single-layer structure and a stacked-layer structure.

The second interlayer insulating film 158 is formed over the connection electrode 148, and the opening portions are formed with etching in a region overlapping with the connection electrode 148 (FIG. 23C). The second insulating film 158 can also be formed with a material and a method which are the same as those of the undercoat 150 and preferably contains silicon oxide.

Next, the source 130, the drain 132, and the signal line 120 are formed (FIG. 24A). These wirings can be formed by using a material usable for the gate 128 with a CVD method or a sputtering method. As shown in FIG. 22, the second capacitor electrode 160 and the current-supplying line 122 are also formed simultaneously with the source 130, the drain 132, and the signal line 120.

Next, the leveling film 162 is formed so as to cover the source 130, the drain 132 and the signal line 120 (FIG. 24A). It is preferred that the leveling film 162 include a polymer material such as an acrylic resin, a polyester, a polyamide, a polyimide, and a polysiloxane. The leveling film 162 can be formed with a wet-type film-formation method such as a spin-coating method, an ink-jet method, and a printing method. The formation of the leveling film 162 enables projections and depressions caused by the transistors and the connection electrode 148 to be absorbed, giving a flat surface.

Although not shown, the first electrode 144 of the light-emitting element is formed over the leveling film 162. When light-emission from the light-emitting element is extracted through the base material 102, the first electrode 144 may be formed by using an oxide with a light-transmitting property so as to transmit visible light, for example. Indium-tin oxide (ITO), indium-zinc oxide (IZO), and the like are represented as an oxide with a light-transmitting property. As a formation method, a sputtering method is given. On the other hand, when the light-emission from the light-emitting element is extracted in a direction opposing the base material 102, a metal with a high reflectance may be used for the first electrode 144 so as to reflect visible light. Specifically, silver, aluminum, or the like is exemplified. Alternatively, an oxide with a light-transmitting property may be stacked over a metal with a high reflectance. Note that an opening reaching the drain 132 of the transistor is formed in the leveling film 162 before the formation of the first electrode 144.

Next, the partition wall 164 is formed (FIG. 24B). The partition wall 164 can be formed with a material usable for the leveling film 162 by applying the aforementioned wet-type film-formation method. It is preferred to form the leveling film 162 and the partition wall 164 so as to include the same material.

Figure 25A:
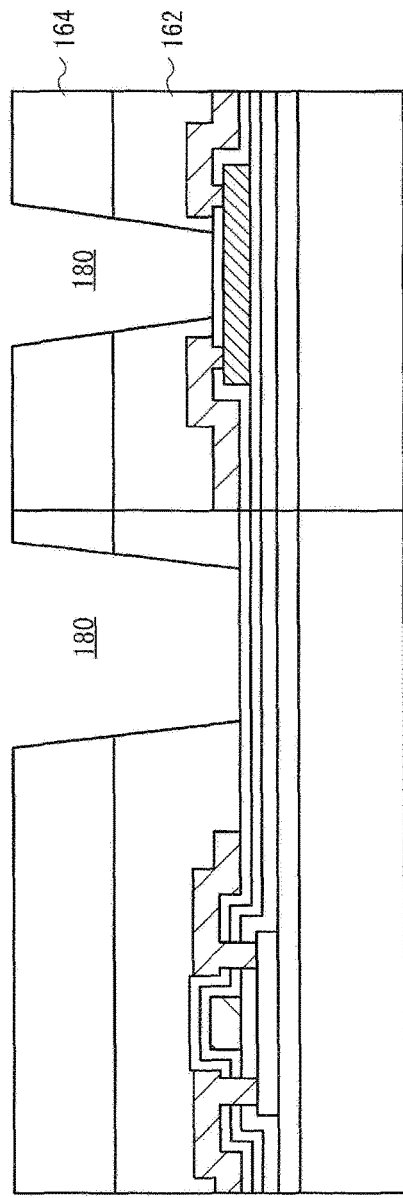
FIG. 25A and FIG. 25B are schematic views showing a manufacturing method of a display device according to an embodiment.

Next, etching is performed on the partition wall 164 and the leveling film 162 to form the opening portion to expose the second interlayer insulating film 158 (FIG. 25A). This opening portion corresponds to the trench 180. The trench 180 may be formed by performing etching simultaneously on the partition wall 164 and the leveling film 162 in one process. Alternatively, the trench 180 may be formed by conducting etching on the partition wall 164 to form an opening and then performing etching on the leveling film 162 under different conditions. In the case where the trench 180 is formed in the partition wall 164 and the leveling film 162 in one process, the side surface of the trench 180 provided by the leveling film 162 and the side surface of the trench 180 provided by the partition wall 164 exist in the same plane as shown in FIG. 25A. On the other hand, when the etching on the partition wall 164 and the leveling film 162 is carried out in different steps to form the trench 180, the step may be formed in the trench 180 as shown in FIG. 5B.

Alternatively, etching may be performed on the leveling film 162 before forming the partition wall 164 to simultaneously form the opening portion in the region where the trench 180 is to be formed and the opening portion reaching the drain 132. In this case, although the opening portion provided in the leveling film 162 is covered with the partition wall 164 temporarily, the trench 180 can be formed by forming an opening portion in the partition wall in a region where the trench 180 is to be formed. In this case, a part of the EL layer 166 is in contact with the second interlayer insulating film 158 as shown in FIG. 5C.

Figure 25B:
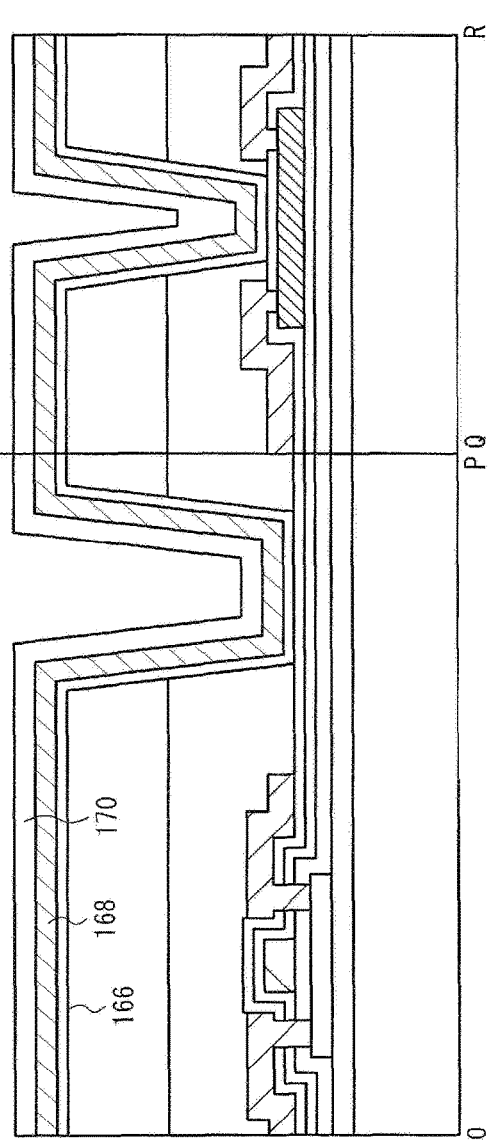

Next, the EL layer 166 and the second electrode 168 are formed (FIG. 25B). The EL layer 166 is formed so as to be in contact with the second interlayer insulating film 158 via the trench 180. As described in the First Embodiment, the EL layer 166 may have the same structure in all of the sub-pixels 106, and a partial structure (emission layer, etc.) may be different between the adjacent sub-pixels 106. The formation of the second electrode 168 may be carried out with a material and a method which are the same as those of the first electrode 144. When the light-emission from the light-emitting element is obtained through the base material 102, a metal with a high reflectance or an alloy thereof may be used. On the other hand, when the light-emission from the light-emitting element is extracted in a direction opposing the base material 102, an oxide with a light-transmitting property, such as ITO and IZO, may be used.

Next, the passivation film 170 for protecting the light-emitting element is formed (FIG. 25B). The passivation film 170 can contain an inorganic compound exemplified by silicon nitride, silicon oxide, or the like and a polymer material such as an acrylic resin, a polyimide, a polyester, and a polycarbonate. Specifically, a structure may be employed in which an acrylic resin is sandwiched by films of silicon nitride. The acrylic resin may be formed with an evaporation method, an ink-jet method, a lamination method, a printing method, and the like.

Through the above processes, the display device of an embodiment of the present invention can be manufactured.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A display device comprising:
    a first sub-pixel;
    a second sub-pixel adjacent to the first sub-pixel; and
    a partition wall located at a boundary between the first sub-pixel and the second sub-pixel, the first sub-pixel and the second sub-pixel each comprising:
        a thin-film transistor including a semiconductor film, a gate electrode, a source electrode, and a drain electrode, the source electrode and the drain electrode being electrically connected to the semiconductor film;
        a gate insulating film between the semiconductor film and the gate electrode;
        an interlayer insulating film over the semiconductor film, the gate electrode, and the gate insulating film and under the source electrode and the drain electrode;
        a leveling film over the source electrode and the drain electrode; and
        a light-emitting element over the leveling film, the light-emitting element including an EL layer between a first electrode and a second electrode,
    wherein:
    an edge portion of the first electrode is covered by the partition wall;
    a part of the second electrode is located over the partition wall;
    an overlapping region where the leveling film overlaps with the partition wall in a plane view is located between the first sub-pixel and the second sub-pixel;
    a trench passing through the leveling film and the partition wall is located in the overlapping region; and
    the EL layer is in contact with the interlayer insulating film via the trench.

2. The display device according to claim 1, further comprising a gate line,
    wherein:
    the gate line is electrically connected to a pixel circuit of the first sub-pixel and a pixel circuit of the second sub-pixel; and
    the trench extends in a direction parallel to the gate line.

3. The display device according to claim 1, further comprising a gate line,
    wherein:
    the gate line is electrically connected to a pixel circuit of the first sub-pixel and a pixel circuit of the second sub-pixel; and
    the trench extends in a direction perpendicular to the gate line.

4. The display device according to claim 3, further comprising:
    a current-supplying line configured to supply current to the pixel circuit of the first sub-pixel; and
    a signal line configured to supply an image signal to the pixel circuit of the second sub-pixel,
    wherein the trench is located between the current-supplying line and the signal line.

5. The display device according to claim 1, further comprising a flexible base material,
    wherein the first sub-pixel and the second sub-pixel are located over the flexible base material.

6. The display device according to claim 1, further comprising a plurality of sub-pixels including the first sub-pixel and the second sub-pixel,
    wherein the trench surrounds each of the plurality of sub-pixels.

7. The display device according to claim 1, further comprising a plurality of sub-pixels including the first sub-pixel and the second sub-pixel,
    wherein the trench surrounds more than one sub-pixels of the plurality of sub-pixels.

8. A display device comprising:
    a first pixel;
    a second pixel adjacent to the first pixel; and
    a partition wall located at a boundary between the first pixel and the second pixel, the first pixel and the second pixel each including a first sub-pixel,
    wherein the first sub-pixel comprising:
        a thin-film transistor having a semiconductor film, a gate electrode, a source electrode, and a drain electrode, the source electrode and the drain electrode being electrically connected to the semiconductor film;
        a gate insulating film between the semiconductor film and the gate electrode;
        an interlayer insulating film over the semiconductor film, the gate electrode, and the gate insulating film and under the source electrode and the drain electrode;
        a leveling film over the source electrode and the drain electrode; and
        a light-emitting element over the leveling film, the light-emitting element including an EL layer between a first electrode and a second electrode,
    an edge portion of the first electrode is covered by the partition wall,
    a part of the second electrode is located over the partition wall,
    an overlapping region where the leveling film overlaps with the partition wall in a plane view is located between the first pixel and the second pixel,
    a trench passing through the partition wall and reaching at least a part of the leveling film is located in the overlapping region, and
    the EL layer is in contact with a bottom surface of the trench.

9. The display device according to claim 8,
    wherein a thickness of the leveling film in the trench is smaller than a thickness of the leveling film facing the first sub-pixel.

10. The display device according to claim 8, further comprising a gate line,
wherein:
the gate line is electrically connected to a pixel circuit in the first pixel and a pixel circuit in the second pixel; and
the trench extends in a direction perpendicular to the gate line and overlaps with the gate line.

11. The display device according to claim 8, further comprising a signal line,
the signal line is electrically connected to a pixel circuit in the first pixel and a pixel circuit in the second pixel; and
the trench extends in a direction intersecting the signal line and overlaps with the signal line.

12. The display device according to claim 8, further comprising:
a signal line; and
a second interlayer insulating film on and in contact with the interlayer insulating film,
wherein:
the signal line is electrically connected to a pixel circuit in the first pixel and a pixel circuit in the second pixel;
the signal line is divided into two portions in a region overlapping with the trench;
the two portions are electrically connected to each other via a connection electrode; and
the connection electrode is located between the interlayer insulating film and the second interlayer insulating film.

13. The display device according to claim 8, further comprising:
a gate line; and
a second interlayer insulating film on and in contact with the interlayer insulating film,
wherein:
the gate line is electrically connected to a pixel circuit in the first pixel and a pixel circuit in the second pixel;
the gate line is divided into two portions in a region overlapping with the trench;
the two portions are electrically connected to each other via a connection electrode; and
the connection electrode is located between the interlayer insulating film and the second interlayer insulating film.

14. The display device according to claim 8, further comprising:
a gate line electrically connected to a pixel circuit in the first pixel and a pixel circuit in the second pixel; and
a signal line electrically connected to one of the pixel circuit in the first pixel and the pixel circuit in the second pixel,
wherein the trench extends in a direction parallel to the signal line and is divided in a region overlapping with the gate line.

15. The display device according to claim 8, further comprising:
a gate line electrically connected to a pixel circuit in the first pixel and a pixel circuit in the second pixel; and
a signal line electrically connected to one of the pixel circuit in the first pixel and the pixel circuit in the second pixel,
wherein the trench extends in a direction parallel to the gate line and is divided in a region overlapping with the signal line.

16. The display device according to claim 8,
wherein:
the trench passes through the leveling film;
the bottom surface of the trench is a top surface of the interlayer insulating film, the top surface being exposed by the trench and being not in contact with the leveling film; and
the EL layer is in contact with the top surface.

17. The display device according to claim 8, further comprising a plurality of pixels including the first pixel and the second pixel,
wherein the trench demarcates more than one pixels of the plurality of pixels in an island shape.

* * * * *